(12) United States Patent
Kawahito

(10) Patent No.: US 8,338,248 B2
(45) Date of Patent: Dec. 25, 2012

(54) SEMICONDUCTOR ELEMENT AND SOLID-STATE IMAGING DEVICE

(75) Inventor: Shoji Kawahito, Hamamatsu (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 0 days.

(21) Appl. No.: 13/142,141

(22) PCT Filed: Dec. 25, 2009

(86) PCT No.: PCT/JP2009/071647
§ 371 (c)(1),
(2), (4) Date: Aug. 10, 2011

(87) PCT Pub. No.: WO2010/074252
PCT Pub. Date: Jul. 1, 2010

(65) Prior Publication Data
US 2011/0298079 A1    Dec. 8, 2011

(30) Foreign Application Priority Data
Dec. 25, 2008  (JP) ................................ 2008-330572

(51) Int. Cl.
*H01L 27/148* (2006.01)

(52) U.S. Cl. ................................ 438/233; 257/E21.133

(58) Field of Classification Search ................ 257/233, 257/257, 292, 414, 444, E31.075, E31.076, 257/E31.081, E31.084, E27.133; 438/48, 438/57
See application file for complete search history.

(56) References Cited

U.S. PATENT DOCUMENTS

| | | | | |
|---|---|---|---|---|
| 4,847,668 A | * | 7/1989 | Sugawa et al. | 257/462 |
| 6,051,447 A | * | 4/2000 | Lee et al. | 438/48 |
| 2001/0040210 A1 | | 11/2001 | Nagata | |
| 2006/0181626 A1 | | 8/2006 | Lee | |
| 2012/0193692 A1 | | 8/2012 | Kawahito et al. | |
| 2012/0193743 A1 | | 8/2012 | Kawahito et al. | |

FOREIGN PATENT DOCUMENTS

| | | |
|---|---|---|
| JP | 05 347401 | 12/1993 |
| JP | 06 097406 | 4/1994 |
| JP | 10 508736 | 8/1998 |

(Continued)

OTHER PUBLICATIONS

International Search Report issued Feb. 9, 2010 in PCT/JP09/071647 filed Dec. 25, 2009.

(Continued)

*Primary Examiner* — Brook Kebede
(74) *Attorney, Agent, or Firm* — Obon, Spivak, McClelland, Maier & Neustadt, L.L.P.

(57) ABSTRACT

A semiconductor element includes: a p-type semiconductor region; an n-type light-receiving surface buried region buried in the semiconductor region; an n-type charge accumulation region buried in the semiconductor region, continuously to the light-receiving surface buried region, establishing a deeper potential well depth than the light-receiving surface buried region; a charge read-out region configured to read out the charges accumulated in the charge accumulation region; an exhaust-drain region buried in the semiconductor region, configured to extract the charges from the light-receiving surface buried region; a first potential controller configured to extract the charges from the light-receiving surface buried region to the exhaust-drain region; and a second potential controller configured to transfer the charges from the charge accumulation region to the charge read-out region.

12 Claims, 11 Drawing Sheets

FOREIGN PATENT DOCUMENTS

| | | |
|---|---|---|
| JP | 2000 236081 | 8/2000 |
| JP | 2001 326341 | 11/2001 |
| JP | 2003 510561 | 3/2003 |
| JP | 2006 514446 | 4/2006 |
| JP | 2008 103647 | 5/2008 |
| WO | 96 15626 | 5/1996 |

OTHER PUBLICATIONS

International Preliminary Report on Patentability issued Jul. 14, 2011 in PCT/JP2009/071647.

* cited by examiner (a)

(b)

(c)

SEMICONDUCTOR ELEMENT AND SOLID-STATE IMAGING DEVICE

TECHNICAL FIELD

The present invention relates to a semiconductor element that has a function for modulating a detection of electrons generated by light in a time domain, and a solid-state imaging device in which these semiconductor elements are arrayed one-dimensionally or two-dimensionally and cyclically.

BACKGROUND ART

A sensor element that has a function for modulating a detection of electrons generated by light inside a pixel, such as "an apparatus for detecting and demodulating an irradiation field whose magnitude is modulated, in a time domain, (see patent document 1)" announced in 1994 or the like is also referred to as a "lock-in pixel"

For example, a three-dimensional imaging system in which a pixel of a light detection detector, a dedicated electronic circuit and a corresponding processor are formed on a common semiconductor substrate by using a CMOS manufacturing technique is proposed (see patent document 2). In an embodiment of the patent document 2, each detector uses a time of flight (TOF) in which an optical pulse emitted by the system is reflected from a point on a physical body and focused and detected by a pixel detector and has a corresponding high speed counter for accumulating a clock pulse number proportional to a TOF data. The TOF data gives a direct digital scale with regard to a distance until the point on the physical body from which the emitted optical pulse is reflected. In another embodiment of the patent document 2, instead of the counter and a high speed clock circuit, a charge accumulator and an electronic shutter (S1) are placed in each pixel detector. Each pixel detector stores charges, and its total amount gives the direct scale of the reciprocating TOF.

PRIOR ART CITATION

Patent Document
  Patent Document 1: JP-1998 (H10)-508736A
  Patent Document 2: JP-2003-510561A

DISCLOSURE OF INVENTION

Technical Problem

However, in the image sensors that use the conventional lock-in pixels, each of lock-in pixels detects and transfers the charges to one or more charge accumulation regions, in synchronization with the modulated light, through a gate structure of a MOS transistor. For this reason, the image sensor using the conventional lock-in pixel is complicated in structure. Also, during transfer of electrons by the gate structure of the MOS transistor, electrons are captured in traps at a boundary between silicon (Si) and silicon oxide film (SiO$_2$), and a problem of an occurrence of a transfer delay is also generated.

In view of the above problems, an object of the present invention is to provide: a solid-state imaging device (lock-in image sensor) in which a structure of a pixel is simple, a high resolution is enabled, a high-speed transfer is enabled and a temporal resolution is improved; and a semiconductor element that can be used as a sensor element (pixel) of the solid-state imaging device.

Technical Solution

In order to achieve the above objects, a first aspect of the present invention inheres in a semiconductor element encompassing: a semiconductor region of first conductivity type; a light-receiving surface buried region of second conductivity type buried in an upper portion of the semiconductor region, implementing a photodiode together with the semiconductor region; a charge accumulation region of second conductivity type buried in an upper portion of the semiconductor region, continuously to the light-receiving surface buried region, establishing a deeper potential well depth than the light-receiving surface buried region, defining depth direction of potential as a field direction along which charges generated in the photodiode are transported; a charge read-out region configured to read out the charges accumulated in the charge accumulation region; an exhaust-drain region buried in an upper portion of the semiconductor region, configured to extract the charges from the light-receiving surface buried region; a first potential control means configured to control a potential of a channel formed in an upper portion of the semiconductor region between the light-receiving surface buried region and the exhaust-drain region, extracting the charges from the light-receiving surface buried region to the exhaust-drain region; and a second potential control means configured to control a potential of a channel formed in an upper portion of the semiconductor region between the charge accumulation region and the charge read-out region, transferring the charges from the charge accumulation region to the charge read-out region.

A second aspect of the present invention inheres in a solid-state imaging device embracing a plurality of pixels being arrayed, each of the pixels encompassing: a semiconductor region of first conductivity type; a light-receiving surface buried region of second conductivity type buried in an upper portion of the semiconductor region, implementing a photodiode together with the semiconductor region; a charge accumulation region of second conductivity type buried in an upper portion of the semiconductor region, continuously to the light-receiving surface buried region, establishing a deeper potential well depth than the light-receiving surface buried region, defining depth direction of potential as a field direction along which charges generated in the photodiode are transported; a charge read-out region configured to read out the charges accumulated in the charge accumulation region; an exhaust-drain region buried in an upper portion of the semiconductor region, configured to extract the charges from the light-receiving surface buried region; a first potential control means configured to control a potential of a channel formed in an upper portion of the semiconductor region between the light-receiving surface buried region and the exhaust-drain region, extracting the charges from the light-receiving surface buried region to the exhaust-drain region; and a second potential control means configured to control a potential of a channel formed in an upper portion of the semiconductor region between the charge accumulation region and the charge read-out region, transferring the charges from the charge accumulation region to the charge read-out region.

Advantageous Effects

According to the present invention, it is possible to provide the solid-state imaging device (lock-in image sensor) in which the structure of the pixel is simple, the high resolution is enabled, the high-speed transfer is enabled and the temporal resolution is improved; and the semiconductor element that can be used as the sensor element (pixel) of the solid-state imaging device.

DETAILED DESCRIPTION OF THE INVENTION

Figure 1:
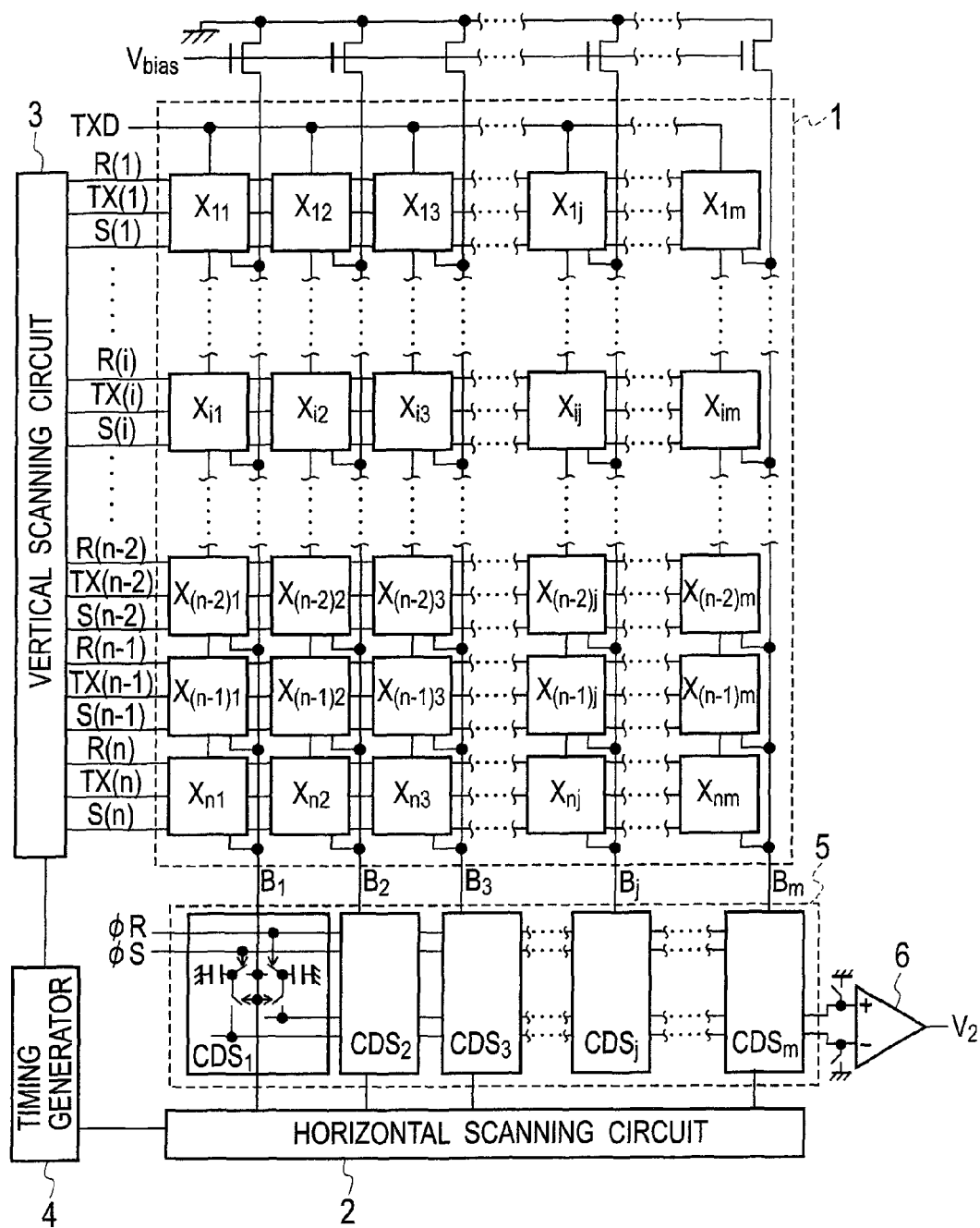
FIG. 1 is a schematic plan view describing a layout on a semiconductor chip of a solid-state imaging device (two-dimensional image sensor) pertaining to a first embodiment of the present invention.

The first and second embodiments of the present invention will be described below with reference to the drawings. In the illustrations of the following drawings, the same or similar reference numerals are given to the same or similar portions. However, attention should be paid to the fact that, since the drawings are only diagrammatic, the relation between the thickness and the planar dimension, and the ratio between the thicknesses of respective layers, and the like differ from the actual values. Thus, the specific thicknesses and dimensions should be judged by referring to the following explanations. Also, of course, the portions in which the mutual dimensional relations and ratios are different are included even between the mutual drawings.

Also, the following first and second embodiments only exemplify the devices and methods that specify the technical idea of the present invention. Thus, as for the technical idea of the present invention, the material qualities, shapes, structures, arrangements and the like of the constituent elements are not limited to the followings. Various modifications can be added to the technical idea of the present invention, within the technical scopes prescribed by claims.

(First Embodiment)

In a solid-state imaging device (two-dimensional image sensor) pertaining to a first embodiment of the present invention, as illustrated in FIG. 1, a pixel array area 1 and peripheral circuit areas (2, 3, 4, 5 and 6) are integrated on the same semiconductor chip. In the pixel array area, a large number of pixels $X_{ij}$ (i=1 to m; j=1 to n: where m, n are integers, respectively) are arrayed in the shape of a two-dimensional matrix, and a rectangular imaging area is implemented. Then, on the lower side of the pixel array area, a horizontal scanning circuit (shift register) 2 is provided along pixel rows $X_{11}$ to $X_{1m}$; . . . ; $X_{i1}$ to $X_{im}$; . . . ; $X_{(n-2)1}$ to $X_{(n-2)m}$; $X_{(n-1)1}$ to $X_{(n-1)m}$; $X_{n1}$ to $X_{nm}$ directions. On the left side of the pixel array area, a vertical scanning circuit (shift register) 3 is provided along pixel columns $X_{j1}$, . . . , $X_{i1}$, . . . , $X_{(n-2)1}$, $X_{(n-1)1}$; $n_{n1}$; $X_{12}$, . . . , $X_{i2}$, . . . ; $X_{(n-2)2}$, $X_{(n-1)2}$, $X_{n2}$; $X_{13}$, . . . , $X_{i3}$, . . . ; $X_{(n-2)3}$, $X_{(n-1)3}$, $X_{n3}$; . . . ; $X_{1j}$, . . . , $X_{ij}$, . . . , $X_{(n-2)j}$, $X_{(n-1)j}$, $X_{nj}$; . . . ; $X_{1m}$, . . . , $X_{im}$, . . . , $X_{(n-2)m}$, $X_{(n-1)m}$, $X_{nm}$ directions. A timing generator 4 is connected to the vertical scanning circuit (shift register) 3 and the horizontal scanning circuit (shift register) 2.

The timing generator 4, the horizontal scanning circuit 2 and the vertical scanning circuit 3 sequentially scan the pixels $X_{ij}$ in the pixel array area so that the read-out of pixel signals and an electronic shuttering operation are executed. That is, the solid-state imaging device pertaining to the first embodiment of the present invention is implemented such that, since the pixel array area is vertically scanned at the respective pixel rows $X_{11}$ to $X_{1m}$; . . . ; $X_{i1}$ to $X_{im}$; . . . ; $X_{(n-2)1}$ to $X_{(n-2)m}$; $X_{(n-1)1}$ to $X_{(n-1)m}$; $X_{n1}$ to $X_{nm}$ units, the pixel signal of each of the pixel rows $X_{11}$ to $X_{1m}$; . . . ; $X_{i1}$ to $X_{im}$; . . . ; $X_{(n-2)1}$ to $X_{(n-2)m}$; $X_{(n-1)1}$ to $X_{(n-1)m}$; $X_{n1}$ to $X_{nm}$ is read out through a vertical signal line assigned to each of the pixel columns $X_{11}, \ldots, X_{i1}, \ldots, X_{(n-2)1}, X_{(n-1)1}, X_{n1}$; $X_{12}, \ldots, X_{i2}, \ldots$; $X_{(n-2)2}, X_{(n-1)2}, X_{n2}$; $X_{13}, \ldots, X_{i3}, \ldots$; $X_{(n-2)3}, X_{(n-1)3}, X_{n3}$; . . . ; $X_{1j}, \ldots, X_{ij}, \ldots, X_{(n-2)j}, X_{(n-1)j}, X_{nj}$; . . . ; $X_{1m}, \ldots, X_{im}, \ldots, X_{(n-2)m}, X_{(n-1)m}, X_{nm}$.

Figure 2:
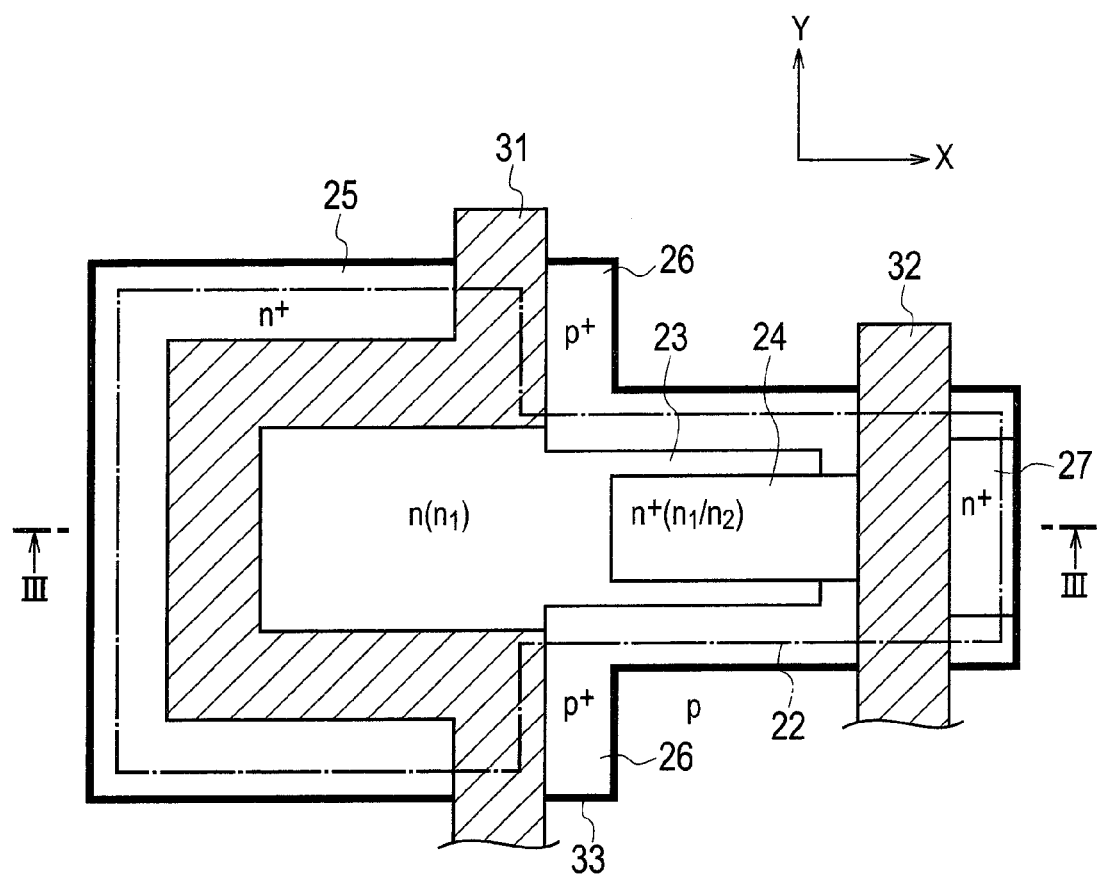
FIG. 2 is a schematic plan view describing a configuration of a semiconductor element serving as a part of pixel in the solid-state imaging device pertaining to the first embodiment of the present invention.

FIG. 2 illustrates an example of the planar structure of the semiconductor element serving as the pixel circuit in each of the pixels $X_{11}$ to $X_{1m}$; . . . ; $X_{i1}$ to $X_{im}$; . . . ; $X_{(n-2)1}$ to $X_{(n-2)m}$; $X_{(n-1)1}$ to $X_{(n-1)m}$; $X_{n1}$ to $X_{nm}$ in the solid-state imaging device pertaining to the first embodiment, and FIG. 3(a) illustrates the corresponding cross-sectional view.

Since FIG. 3(a) illustrates a cross-sectional configuration taken from direction of the semiconductor element illustrated in FIG. 2, FIG. 3(a) is firstly described. As illustrated in FIG. 3(a), the semiconductor element includes: a semiconductor region 21 of first conductivity type (p-type); a light-receiving surface buried region (light-receiving cathode region) 23 of second conductivity type (n-type) that is buried in a part of an upper portion of the semiconductor region 21 so as to receive incoming light, implementing a photodiode together with the semiconductor region 21; a charge accumulation region 24 of second conductivity type ($n^+$-type), which is buried in a part of the upper portion of the semiconductor region 21, adjacently (continuously) to the light-receiving surface buried region (light-receiving cathode region) 23 and in which, when a field direction along which charges generated in the photodiode are transported, a depth of a potential well (electron well) is deeper than that of the light-receiving surface buried region (light-receiving cathode region) 23 (see FIGS. 3(b) and 3(c)), and the charges generated in the light-receiving surface buried region (light-receiving cathode region) 23 are accumulated; a charge read-out region 27 of second conductivity type ($n^+$-type) for receiving the charges accumulated in the charge accumulation region 24; and an exhaust-drain region 25 of second conductivity type ($n^+$-type) for exhausting electrons generated in the light-receiving surface buried region (light-receiving cathode region) 23. Electrons are transported to a direction in which a potential is high, and holes are transported to a direction in which a potential is low. Thus, in this specification, "the field direction for transporting the signal charges" implies a direction opposite to lines of electric force for electrons and implies a direction of the lines of electric force for holes.

As illustrated by dash-dotted line in FIG. 2, a well (p-well) 22 of first conductivity type having a higher impurity concentration than the semiconductor region 21 is formed so as to surround the charge read-out region 27 and the exhaust-drain region 25. FIG. 3(a) exemplifies a case in which the semiconductor region 21 of first conductivity type is used as "the semiconductor region of first conductivity type". However, instead of the semiconductor region 21, a silicon epitaxial growth layer of first conductivity type whose impurity concentration is lower than that of the semiconductor substrate formed on the semiconductor substrate of first conductivity type may be formed, and the epitaxial growth layer may be employed as the semiconductor region 21 of first conductivity type. Or, a silicon epitaxial growth layer of first conductivity type (p-type) is formed on the semiconductor substrate of second conductivity type (n-type), and the epitaxial growth layer may be employed as the semiconductor region 21 of first conductivity type. When the epitaxial growth layer of first conductivity type (p-type) is formed on the semiconductor substrate of second conductivity type (n-type) so that a pn junction is formed, with light of a long wavelength, the light is penetrated into a deep portion of the semiconductor substrate of second conductivity type. However, the potential barrier caused by a built-in potential of pn junction prohibits carriers, which is caused by the light in the semiconductor substrate of second conductivity type, from being penetrated into the epitaxial growth layer of first conductivity type. Thus, it is possible to positively remove the carriers generated in the deep portion of the semiconductor substrate of second conductivity type. Consequently, it is possible to protect the carriers, which are generated in the deep portion, from being spread, returned and leaked into adjacent pixels. In particular, the pn junction structure can achieve effectiveness such that colors are not mixed in a single-chip image sensor on which color filters of RGB are placed.

The light-receiving surface buried region (light-receiving cathode region) 23 and the semiconductor region (anode region) 21 just under the light-receiving surface buried region (light-receiving cathode region) 23 implement a first buried photodiode (hereafter, merely referred to as "photodiode") D1. A charge accumulation region (cathode region) 24 and the semiconductor region (anode region) 21 just under the charge accumulation region 24 implement a second buried photodiode (hereafter, referred to as "a charge storage photodiode") D2.

A $p^+$-type pinning layer 26 is arranged from on the light-receiving surface buried region 23 to on the charge accumulation region 24. The $p^+$-type pinning layer 26 serves as the layer for suppressing the carriers from being generated on the surface at a dark period, and the $p^+$-type pinning layer 26 is used as the layer preferable for dark current reduction.

Gate insulating films 30 are formed on a part of the semiconductor region 21 on the $p^+$-type pinning layer 26 and on a part of the semiconductor region 21 between the light-receiving surface buried region 23 and a charge read-out region 27. As the gate insulating films 30, a silicon oxide film ($SiO_2$) is preferable. However, various insulated-gate structures employed in insulated-gate transistors (MIS transistors) may be used other than the silicon oxide film ($SiO_2$ film). For example, the ONO film implemented by the triple-layer laminated film of silicon oxide film ($SiO_2$ film)/silicon nitride film ($Si_3N_4$ film)/silicon oxide film ($SiO_2$ film) may be used. Moreover, the oxide that includes at least one element of strontium (Sr), aluminum (Al), magnesium (Mg), yttrium (Y), hafnium (Hf), zirconium (Zr), tantalum (Ta) and bismuth (Bi), or the silicon nitride that includes those elements, or the like can be used as the gate insulating films 30.

On the gate insulating film 30, a read-out gate electrode 32 is arranged which controls a potential of a transferring channel formed between the charge accumulation region 24 and the charge read-out region 27 and transfers the charges from the charge accumulation region 24 to the charge read-out region 27, and an exhaust-gate electrode 31 is arranged which controls a potential of an exhausting channel formed between the light-receiving surface buried region 23 and the exhaust-drain region 25 and transfers electrons generated in the light-receiving surface buried region 23, from the light-receiving surface buried region 23 to the exhaust-drain region 25. On the gate insulating film 30, an inter-layer insulating film 36 is formed, which includes the read-out gate electrode 32 and the exhaust-gate electrode 31. The gate insulating film 30 and the exhaust-gate electrode 31 on the gate insulating film 30 implement first potential control means (31, 30) which control the potential of the channel formed in the upper portion of the semiconductor region 21 between the light-receiving surface buried region 23 and the exhaust-drain region 25 and exhaust charges from the light-receiving surface buried region 23 to the exhaust-drain region 25. Also, the gate insulating film 30 and the read-out gate electrode 32 on the gate insulating film 30 implement second potential control means (32, 30) which control the potential of the channel formed in the upper portion of the semiconductor region 21 between the exhaust-gate electrode 31, the charge accumulation region 24 and a charge read-out region and transfer the charges from the charge accumulation region 24 to the charge read-out region.

FIGS. 3(b) and 3(c) are potential diagrams taken on a cross-section on which in the cross-sectional view of FIG. 3(a), the light-receiving surface buried region 23, the charge accumulation region 24 and the charge read-out region 27 are cut on a horizontal plane, and the charges (electrons) are illustrated by solid circles. Corresponding to the positions illustrated in FIG. 3(a), the left side of the central portion in each of FIGS. 3(b) and 3(c) illustrates a potential well (first potential well) PW1 of a conduction band edge of the light-receiving surface buried region 23. Moreover, a potential well (second potential well) PW2 of a conduction band edge of the charge accumulation region 24 is illustrated on the right side of the first potential well PW1. Moreover, on the right side of the second potential well PW2, the potential well of the charge read-out region 27 is indicated by diagonal hatch with upward oblique lines to the right. The potential barrier between the second potential well PW2 and the potential well of the charge read-out region 27 corresponds to a potential profile of the conduction band edge of the semiconductor region 21 just under the read-out gate electrode 32. On the other hand, on the left side of the first potential well PW1, the potential well of the exhaust-drain region 25 is indicated by diagonal hatch with upward oblique lines to the right. The potential barrier between the first potential well PW1 and the potential well of the exhaust-drain region 25 corresponds to the potential profile of the conduction band edge of the semiconductor region 21 just under the exhaust-gate electrode 31. In the description of the solid-state imaging device pertaining to the first embodiment, a case in which the first conductivity type is p-type, the second conductivity type is n-type, and the charges, to which various processes such as the transfer, the accumulation and the like are supposed, are electrons is exemplified and described. For this reason, in the potential diagrams illustrated in FIGS. 3(b) and 3(c), the downward direction (depth direction) on the drawing is assumed to be the positive direction of the potential, and the downward direction is the field direction in which the charges generated in the photodiode are transferred. Thus, in a case in which the first conductivity type is n-type, the second conductivity type is p-type, and the electrical polarities are opposite, the charges being subjected to processes are holes. However, for holes, the potential shape that indicates the potential barrier, the potential valley, and the potential well and the like is represented such that the downward direction (depth direction) on the drawing is assumed to be the negative direction of the potential. Nevertheless, even in a case where the charges are holes, although the potential polarity is opposite, the downward direction in FIGS. 3(b) and 3(c) is the field direction for transporting the charges (holes) generated by the photodiode.

As illustrated in FIGS. 3(b) and 3(c), under a situation that the potential barrier is not formed between the light-receiving surface buried region 23 and the charge accumulation region 24, in order that a depth of the first potential well PW1 when the light-receiving surface buried region 23 is fully-depleted is shallower than a depth of the second potential well PW2 in a staircase pattern (step-like pattern) when the charge accumulation region 24 is fully-depleted, the respective impurity concentrations may be selected, for example, such that the impurity concentration of the charge accumulation region 24 is higher than the impurity concentration of the light-receiving surface buried region 23 in the staircase pattern. As a method for establishing a potential profile such that the impurity concentration of the charge accumulation region 24 to be higher than the impurity concentration of the light-receiving surface buried region 23 in the staircase pattern, it is possible to employ the known various methodologies. However, in order to avoid the formation of the potential barrier caused by a misalignment of mask positions on a planar pattern illustrated in FIG. 2, as illustrated in FIG. 2, n-type impurity ions are implanted into the charge accumulation region 24 two times (an impurity concentration $n_1$ and an impurity concentration $n_2$) so that the deep second potential well PW2 is formed, and the ions are implanted into the region in which the shallow first potential well PW1 is desired to be formed, only one time (only the impurity concentration $n_1$). That is, the mask for the ion implantation to achieve the impurity concentration $n_1$ into a wide area that includes both of the light-receiving surface buried region 23 and the charge accumulation region 24 on the plan view in FIG. 2 and the mask for the ion implantation of the impurity concentration $n_2$ into a narrow area formed by only the charge accumulation region 24 are prepared. Then, with the mask alignment, the region into which the ions are selectively implanted only one time and the region into which the ions are selectively implanted two times are formed, and the impurity profile of the staircase pattern may be achieved.

The rectangular $p^+$-type pinning layer 26, which is arranged on the light-receiving surface buried region 23 and the charge accumulation region 24 in the cross-sectional view in FIG. 3(a), is thrusting outward from both sides of the light-receiving surface buried region 23, spanning to the lower portion from the upper portion of the light-receiving surface buried region 23 in the plan view of FIG. 2, and similarly thrusting outward from both sides of the charge accumulation region 24, spanning to the lower portion from the upper portion of the charge accumulation region 24. That is, in FIG. 2, the planar pattern of the $p^+$-type pinning layer 26 is a cross-like area occupied by the light-receiving surface buried region 23, the charge accumulation region 24 and the areas protruding on both sides of the light-receiving surface buried region 23 and the charge accumulation region 24. As shown on the plan view in FIG. 2, so as to surround a part of the top end of the light-receiving surface buried region 23 and a part of the left end and the bottom end, the exhaust-gate electrode 31 is bent at a right angle and extended so as to exhibit an omega shape. Then, outside the exhaust-gate electrode 31, the U-shaped exhaust-drain region 25 is formed to surround a part of the exhaust-gate electrode 31. The exhaust-drain region 25 and the exhaust-gate electrode 31 are connected to each other through a surface wiring whose illustration is omitted. The $p^+$-type pinning layer 26 is formed on the light-receiving surface buried region 23. Thus, when focusing to the topmost layer of the semiconductor region 21, the omega-shaped exhaust-gate electrode 31 is bent in the omega shape and extended between the $p^+$-type pinning layer 26 and the U-shaped exhaust-drain region 25. Moreover, the read-out gate electrode 32 is extended between the $p^+$-type pinning layer 26 and the $n^+$-type charge read-out region 27.

As shown on the plan view in FIG. 2, so as to surround the light-receiving surface buried region 23, the charge accumulation region 24, the charge read-out region 27 and the exhaust-drain region 25, a well (p-well) 22 of first conductivity type is formed outside an area illustrated by the dash-dotted line. A thick solid line surrounding the p+-type pinning layer 26, which is located in an outer area than the dash-dotted line, indicates a boundary of an element isolation region. That is, the portion outside the thick solid line that surrounds the pinning layer 26 is the region of an element-isolation insulating film 35 that is thicker than a gate insulating film used in a local oxidation of silicon (LOCOS) methodology or a shallow trench isolation (STI) methodology (see FIG. 3(a)). In each of the read-out gate electrode 32 and the exhaust-gate electrode 31, both of the ends are extended in Y-directions and wired up to over the element-isolation insulating film 35, extending outside of the thick solid line surrounding the pinning layer 26, as illustrated in FIG. 2.

For example, when a high voltage (positive voltage) as the control signal TXD is applied to the exhaust-gate electrode 31 connected to the exhaust-drain region 25, an inclination of a depleted potential is generated from the light-receiving surface buried region 23 to the exhaust-drain region 25, as illustrated in FIG. 3(c). With the electric field caused by the potential profile of the inclination as illustrated in FIG. 3(c), most of electrons generated in the light-receiving surface buried region 23 are extracted to the exhaust-drain region 25.

On the other hand, when a low voltage (0V or a negative voltage of about −1V) as the control signal TXD is applied to the exhaust-gate electrode 31, the potential barrier against electrons is formed between the light-receiving surface buried region 23 and the exhaust-drain region 25, and the inclination of the depleted potential is generated from the light-receiving surface buried region 23 to the charge accumulation region 24, as illustrated in FIG. 3(b). Thus, the extraction of electrons is stopped from the light-receiving surface buried region 23 to the exhaust-drain region 25. Hence, with the electric field caused by the potential profile as illustrated in FIG. 3(b), most of electrons (charges) generated in the light-receiving surface buried region 23 are transferred to the charge accumulation region 24.

As mentioned above, without any installation of the special gate structure between the light-receiving surface buried region 23 and the charge accumulation region 24, only by controlling the potential of the exhaust-gate electrode 31, it is possible to modulate the accumulation to the charge accumulation region 24 of electrons generated by the light. Also, when the low voltage as the control signal TXD is applied to the exhaust-gate electrode 31, the inclination of the depleted potential is generated from the light-receiving surface buried region 23 to the charge accumulation region 24. Thus, it is possible to achieve the perfect transfer by which all of charges are transferred from the light-receiving surface buried region 23 to the charge accumulation region 24. The perfect transfer enables the protection of an afterimage and enables the protection of the generation of the random noise caused by the remnant charges.

In this way, according to the solid-state imaging device pertaining to the first embodiment, by controlling the potential of the exhaust-gate electrode 31 for extracting the generated optical electrons, it is possible to control the transfer of charges to the charge accumulation region 24. Thus, the structure of the pixel is simplified, which enables a higher resolution. Also, a gate structure and a switch do not exist on a charge transfer route from the light-receiving surface buried region 23 to the charge accumulation region 24. Thus, when electrons are passed under the gate electrode, electrons are not trapped on the silicon/oxide film boundary (Si—SiO$_2$ boundary). Hence, the high-speed transfer is enabled, thereby improving a temporal resolution. Moreover, because the light-receiving surface buried region 23 and the charge accumulation region 24 are merged as a single buried photodiode, the solid-state imaging device pertaining to the first embodiment is advantageous from the standpoint of the suppression of the noise, such as dark current noise, transfer noise and the like.

Figure 3:
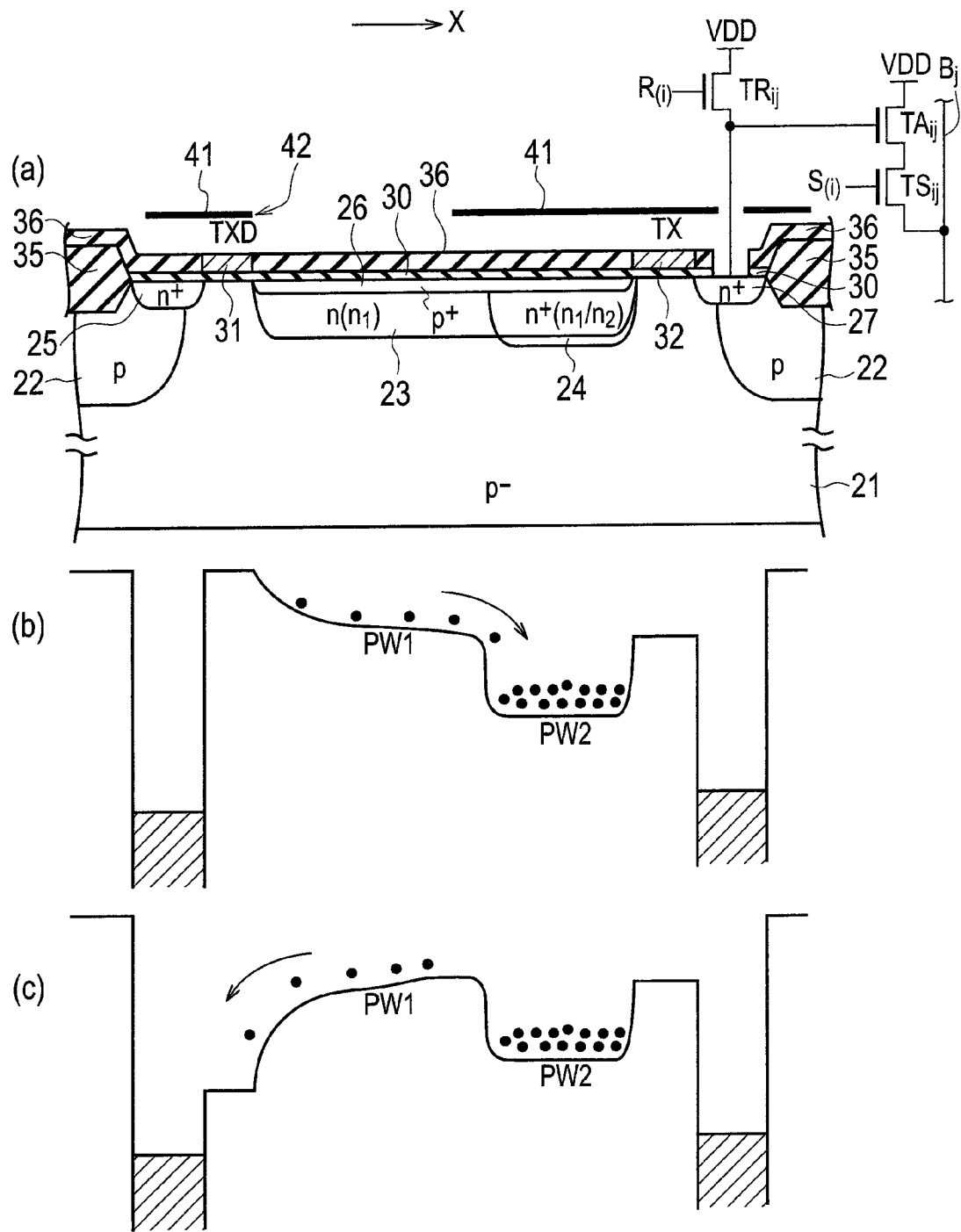
FIG. 3(a) is a schematic cross-sectional view taken from III-III direction in FIG. 2.
FIG. 3(b) is a potential diagram describing a manner of transferring of charges (electrons) to a charge accumulation region, in which a downward direction is indicated as positive direction of potential (hereafter, in the descriptions of the drawings of the present invention, the positive directions of the potentials in the potential diagrams are all described as the downward directions).
FIG. 3(c) is a potential diagram describing a manner by which the charges are extracted to an exhaust-drain region.
Figure 4:
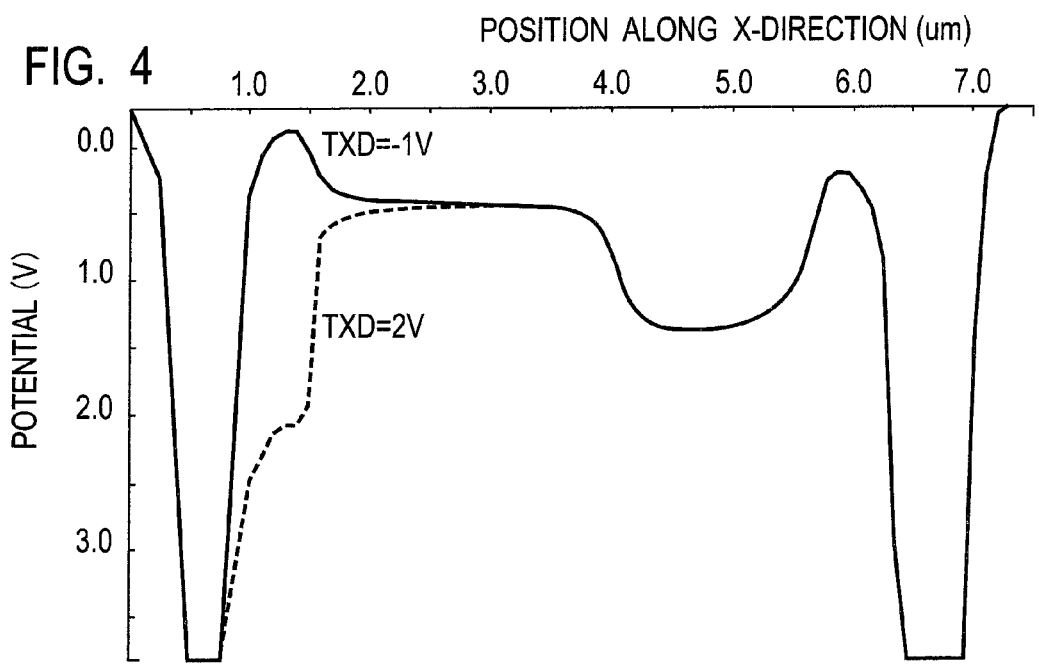
FIG. 4 is a potential diagram when a control signal is applied to an exhaust-gate electrode, and a dashed line indicates a potential diagram when a high voltage is applied as the control signal, and a solid line indicates a potential diagram when a low voltage is applied as the control signal.

In FIG. 4, in a case that the high voltage (2V) as the control signal TXD is applied to the exhaust-gate electrode 31 indicated by a dashed line and a case that the low voltage (−1V) as the control signal TXD is applied to the exhaust-gate electrode 31 indicated by a solid line, the maximum potentials along horizontal direction in the cross-sectional view in FIG. 3(a) are determined through simulation and plotted. In this way, the control signal TXD applied to the exhaust-gate electrode 31 is known to be able to control the direction of the potential inclination in the light-receiving surface buried region 23.

On the other hand, the read-out gate electrode 32 electrostatically controls the potential of the transferring channel through the gate insulating film 30. For example, when the low voltage (0V or the negative voltage) as the control signal TXD is applied to the read-out gate electrode 32, the potential barrier against electrons is formed between the charge accumulation region 24 and the charge read-out region 27. Thus, the charges are not transferred from the charge accumulation region 24 to the charge read-out region 27. On the other hand, when the high voltage (positive voltage) as the control signal TXD is applied to the read-out gate electrode 32, the height of the potential barrier between the charge accumulation region 24 and the charge read-out region 27 is decreased or extinguished. Hence, the charges are transferred from the charge accumulation region 24 to the charge read-out region 27.

As illustrated in FIG. 3(a), a gate electrode of a signal read-out transistor (amplification transistor) TA$_{ij}$ implementing a read-out buffer amplifier is connected to the charge read-out region 27. A drain electrode of the signal read-out transistor (amplification transistor) TA$_{ij}$ is connected to a power supply VDD, and a source electrode is connected to a drain electrode of a switching transistor TS$_{ij}$ for pixel selection. A source electrode of the switching transistor TS$_{ij}$ for the pixel selection is connected to a vertical signal line B$_j$, and a control signal S(i) for selecting a horizontal line is applied to the gate electrode from a vertical scanning circuit 3. When the control signal S(i) for selecting is set to high (H) level, the switching transistor TS$_{ij}$ is turned on, and a current, which is amplified by the signal read-out transistor (amplification transistor) TA$_{ij}$ and corresponds to the potential of the charge read-out region 27, flows through the vertical signal line B$_j$. Moreover, a source electrode of a reset transistor TR$_{ij}$ implementing the buffer amplifier for reading out is connected to the charge read-out region 27. A drain electrode of the reset transistor TR$_{ij}$ is connected to the power supply VDD, and a reset signal R(i) is applied to the gate electrode. By setting the reset signal R(i) to high (H) level, the charges accumulated in the charge read-out region 27 are extracted, and the charge read-out region 27 is reset.

The semiconductor region 21 preferably has an impurity concentration of about $5\times10^{12}$ cm$^{-3}$ or more and about $5\times10^{16}$ cm$^{-3}$ or less. The light-receiving surface buried region 23 has an impurity concentration of about $1\times10^{17}$ cm$^{-3}$ or and about $8\times10^{18}$ cm$^{-3}$ or less, and preferably has an impurity concentration of about $2\times10^{17}$ cm$^{-3}$ or more and about $1\times10^{18}$ cm$^{-3}$ or less, and typically, for example, a value of about $8\times10^{17}$ cm$^{-3}$ at which the depletion is relatively easy can be employed. Its thickness can be set between about 0.1 and three micrometers, preferably between about 0.5 and 1.5 micrometers. On the other hand, the charge accumulation region 24 has an impurity concentration of about $1 \times 10^{19}$ cm$^{-3}$ or more and about $1 \times 10^{21}$ cm$^{-3}$ or less and preferably has an impurity concentration of about $2 \times 10^{19}$ cm$^{-3}$ or more and about $5 \times 10^{29}$ cm$^{-3}$ or less, and typically, for example, a value of about $3 \times 10^{19}$ cm$^{-3}$ can be employed. Its thickness can be set between about 0.1 and three micrometers and preferably between about 0.5 and 1.5 micrometers. The impurity concentration of the charge accumulation region 24 may be set to be about five to 1000 times the impurity concentration of the light-receiving surface buried region 23, preferably, about ten to 300 times.

When the gate insulating film 30 is made of thermal oxide film, the thickness of the thermal oxide film may be set to about 150 nm or more and about 1000 nm or less, preferably, about 200 nm or more and 400 nm or less. When the gate insulating film 30 is made of dielectric film other than the thermal oxide film, an equivalent thickness converted with respect to a relative dielectric constant $\in_r$ of the thermal oxide film may be used (at 1 MHz, $\in_r$=3.8). For example, when a CVD oxide film having a relative dielectric constant $\in_r$=4.4 is used, a thickness in which the foregoing thickness is multiplied by 1.16 (=4.4/3.8) may be employed, and when a silicon nitride (Si$_3$N$_4$) film having a relative dielectric constant $\in_r$=7 is used, a thickness in which the foregoing thickness is multiplied by 1.84 (=7/3.8) may be employed. However, the oxide film (SiO$_2$ film) produced by the standard CMOS technique is preferred to be used, and the use of the field oxide film in the CMOS technique is suitable for the simplification of the manufacturing steps.

As illustrated in FIG. 3(a), an opening 42 of a light shielding film 41 is selectively made so that the photo-generated charges can be generated in the semiconductor region 21 just under the light-receiving surface buried region 23 implementing the photodiode D1. Although FIG. 3(a) illustrates only the gate insulating film 30, the light shielding film 41 may be implemented by a metallic thin film, such as aluminum (Al) and the like, which is formed on any upper portion of a plurality of inter-layer insulating films, establishing a multi-level wiring structure whose illustration is omitted.

(Modification of First Embodiment)

Figure 5:
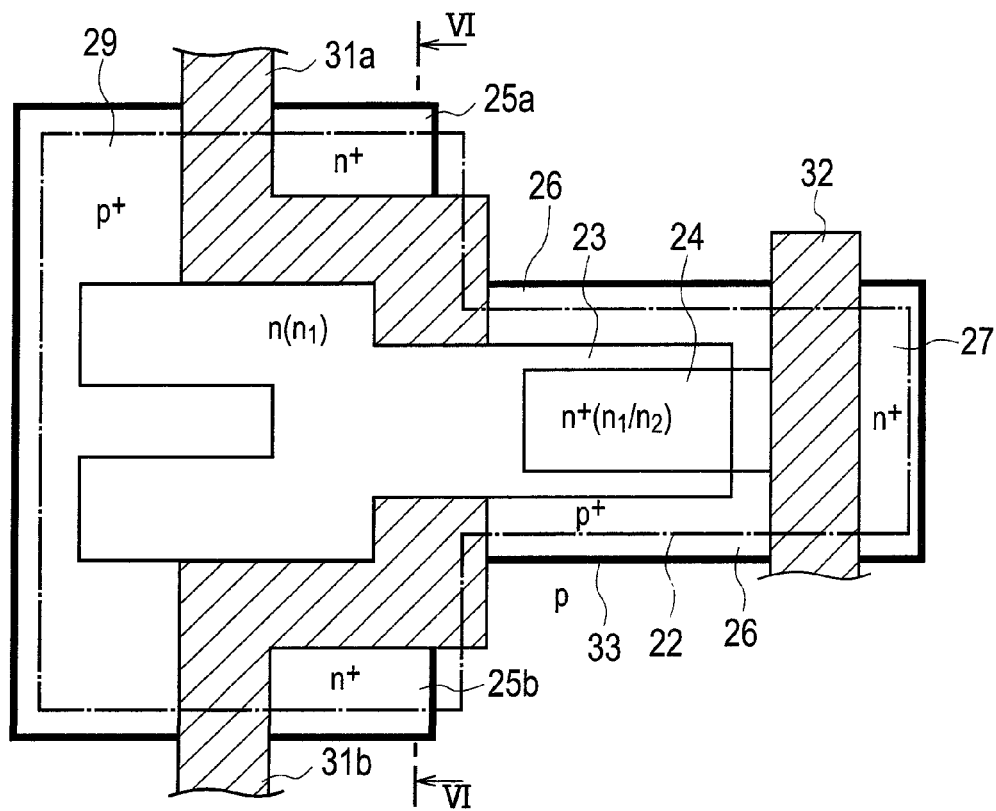
FIG. 5 is a schematic plan view describing a configuration of a semiconductor element serving as a part of pixel of a solid-state imaging device according to a modification of the first embodiment of the present invention.

As illustrated in FIG. 5, a solid-state imaging device pertaining to a modification of the first embodiment includes: a light-receiving surface buried region 23 of second conductivity type (n-type) in which the semiconductor element serving as each pixel in the solid-state imaging device receives the incoming light; a charge accumulation region 24 of second conductivity type (n$^+$-type) which is buried partially overlapped with the light-receiving surface buried region 23 and deeper in potential well (electron well) depth than the light-receiving surface buried region 23 (see FIGS. 3(b) and 3(c)) and accumulates the charges generated in the light-receiving surface buried region 23; a charge read-out region 27 of second conductivity type (n$^+$-type) which receives the charges accumulated in the charge accumulation region 24; and a first exhaust-drain region 25a and a second exhaust-drain region 25b of second conductivity type (n$^+$-type) which exhaust electrons generated in the light-receiving surface buried region 23. The light-receiving surface buried region 23 is delineated to the shape of a bifurcated fork.

In order to exhibit the potential profile in which, without any installation of the potential barrier between the light-receiving surface buried region 23 and the charge accumulation region 24, the depth of the first potential well PW1 when the light-receiving surface buried region 23 is fully-depleted is shallower than the depth of the second potential well PW2 when the charge accumulation region 24 is fully-depleted in a staircase pattern, the respective impurity concentrations may be selected as mentioned above. In order to avoid the formation of the potential barrier caused by the misalignment of mask positions on the planar pattern illustrated in FIG. 5, as illustrated in FIG. 5, n-type impurity ions are implanted into the charge accumulation region 24 two times (the impurity concentration $n_1$ and the impurity concentration $n_2$) so that the deep second potential well PW2 is formed, and n-type impurity ions are implanted into the region in which the shallow first potential well PW1 is desired to be formed only one time (only the impurity concentration $n_1$).

As illustrated in FIG. 2, when a pattern is used in which a width measured in a direction vertical to the charge transfer direction of the light-receiving surface buried region 23 is wider than the charge accumulation region 24 or approximately similar to the width of the charge accumulation region 24, the control of the impurity concentration and the like are required in order to make the second potential well PW2 deeper than the first potential well PW1. In the solid-state imaging device pertaining to the modification of the first embodiment, the planar structure of the semiconductor element inside each of the pixels $X_{11}$ to $X_{1m}$; $X_{21}$ to $X_{2m}$; . . . ; $X_{n1}$ to $X_{nm}$ is delineated to a shape of a bifurcated fork, as illustrated in FIG. 5. Consequently, a light-receiving surface buried region 23a in a portion of the bifurcated fork is easily depleted. That is, when focusing to the portion of the bifurcated fork, a bottom of the first potential well PW1 (potential at depleted state) can be effectively made higher than a bottom of the second potential well PW2. That is, when a part of the light-receiving surface buried region 23 is delineated to a narrow-band shape (striped shape), the portion of the pattern of the narrow-band shape (striped shape) is easily depleted, which can effectively make the bottom of the first potential well PW1 (potential at depleted state) higher than the bottom of the second potential well PW2.

Thus, the shape of the light-receiving surface buried region 23 is not limited to only the shape of the bifurcated fork. The shape of a trifurcated fork (three pronged fork) or the shape of a comb having four or more teeth may be used. Instead of the configuration in which the charge accumulation region 24 and the light-receiving surface buried region 23 are made different in the impurity concentration, at least a part of the planar pattern of the light-receiving surface buried region 23 is made narrow, which can easily deplete the light-receiving surface buried region 23 in the narrow portion, and thus, in this planar topology, the light-receiving surface buried region 23 and the charge accumulation region 24 may be equal in the impurity concentration. When the impurity concentration of the charge accumulation region 24 is set to be higher than that of the light-receiving surface buried region 23, the bottom of the potential well in the portion of the narrow-band shape (stripe-shaped) pattern, which serves as a part of the light-receiving surface buried region 23, becomes the shallowest. As a result, the bottom of the first potential well PW1 has two levels of potentials. Hence, along the charge transfer route to the charge accumulation region 24 from the light-receiving surface buried region 23, a process along the steps of two stages are generated in the bottom of the potential well.

As FIG. 6(a) illustrates the cross-sectional view taken from VI-VI direction in FIG. 5, the light-receiving surface buried region 23 and the first exhaust-drain region 25a and second exhaust-drain region 25b, which are arranged at positions where the light-receiving surface buried region 23 is sandwiched from both sides, are buried in a part of the surface of the semiconductor region 21 of first conductivity type (p-type). The p$^+$-type pinning layer 26 is arranged on the light-receiving surface buried region 23. Then, gate insulating films (whose illustrations are omitted) are formed on the p$^+$-type pinning layer 26, on the semiconductor region 21 between the p$^+$-type pinning layer 26 and the first exhaust-drain region 25a, and on the semiconductor region 21 between the p$^+$-type pinning layer 26 and the second exhaust-drain region 25b (the p$^+$-type pinning layer 26 may have the shape of the bifurcated fork similarly to the light-receiving surface buried region 23, or may have a pattern in which the two-way branched portions are continuous). On the gate insulating films, a first exhaust-gate electrode 31a and a second exhaust-gate electrode 31b are arranged for exhausting electrons, which are generated in the light-receiving surface buried region 23, to the first exhaust-drain region 25a and the second exhaust-drain region 25b, respectively. The first exhaust-drain region 25a and the first exhaust-gate electrode 31a are connected to each other through the surface wiring whose illustrations are omitted, and the second exhaust-drain region 25b and the second exhaust-gate electrode 31b are connected to each other through the surface wiring whose illustrations is omitted. Although the illustration is omitted, similarly to the illustration in FIG. 3(a), an inter-layer insulating film, which includes the first exhaust-gate electrode 31a and the second exhaust-gate electrode 31b, is formed on the gate insulating film.

Although the illustration of the cross-sectional view along the X-direction to the charge accumulation region 24 from the light-receiving surface buried region 23 is omitted, the charge accumulation region 24 and the charge read-out region 27 are also buried in a part of the surface of the semiconductor region 21, similarly to the illustration in FIG. 3(a), as can be understood from FIG. 5. That is, as illustrated in FIG. 5, the p$^+$-type pinning layer 26 is arranged on an area spanning from the light-receiving surface buried region 23 to the charge accumulation region 24. Then, the gate insulating films are formed on the p$^+$-type pinning layer 26, on a part of the semiconductor region 21 between the p$^+$-type pinning layer 26 and the first exhaust-drain region 25a, on a part of the semiconductor region 21 between the p$^+$-type pinning layer 26 and the second exhaust-drain region 25b, and on a part of the semiconductor region 21 between the light-receiving surface buried region 23 and the charge read-out region 27.

As illustrated in FIG. 5, the read-out gate electrode 32 for transferring the charges from the charge accumulation region 24 to the charge read-out region 27 is arranged between the charge accumulation region 24 and the charge read-out region 27. The read-out gate electrode 32 controls the potential of the transferring channel, which is formed between the charge accumulation region 24 and the charge read-out region 27, through the gate insulating film (whose illustration is omitted) and transfers the charges from the charge accumulation region 24 to the charge read-out region 27. The gate insulating film 30 and the read-out gate electrode 32 on the gate insulating film 30 implement the second potential control means (32, 30) for controlling the potential of the channel, which are formed in the upper portion of the semiconductor region 21 between the exhaust-gate electrode 31, the charge accumulation region 24 and the charge read-out region, and transferring the charges from the charge accumulation region 24 to the charge read-out region.

Moreover, the first exhaust-gate electrode 31a, which is bent at a right angle so as to exhibit a shape of character Z, is arranged between the light-receiving surface buried region 23 and the first exhaust-drain region 25a, and the second exhaust-gate electrode 31b, which is bent at a right angle so as to exhibit the shape of character Z, is arranged between the light-receiving surface buried region 23 and the second exhaust-drain region 25b. The gate insulating film 30, and the first exhaust-gate electrode 31a and the second exhaust-gate electrode 31b, which are located on the gate insulating film 30, implement first potential control means (31a, 31b and 30) that control the potentials of the channels, which are formed in an upper portion of the semiconductor region 21 between the light-receiving surface buried region 23 and the first exhaust-drain region 25a, and an upper portion of the semiconductor region 21 between the light-receiving surface buried region 23 and the second exhaust-drain region 25b, respectively, and exhaust charges from the light-receiving surface buried region 23 to the first exhaust-drain region 25a and the second exhaust-drain region 25b, respectively. In FIG. 5, although the first exhaust-gate electrode 31a and the second exhaust-gate electrode 31b are represented as two separate patterns spatially independent of each other in a planar pattern, the first exhaust-gate electrode 31a and the second exhaust-gate electrode 31b serve as a part of a single first potential control means (31a, 31b and 30) which are electrically short-circuited to each other and to which the same control signal TXD is applied. Thus, the first exhaust-gate electrode 31a and the second exhaust-gate electrode 31b may be connected through the same poly-silicon film to a portion outside a range of the paper, or the first exhaust-gate electrode 31a and the second exhaust-gate electrode 31b may be connected to a different surface wiring through an inter-layer insulating film.

The first exhaust-gate electrode 31a controls the potential of the exhausting channel formed between the light-receiving surface buried region 23 and the first exhaust-drain region 25a and extracts electrons generated in the light-receiving surface buried region 23, from the light-receiving surface buried region 23 to the first exhaust-drain region 25a. The second exhaust-gate electrode 31b controls the potential of the exhausting channel formed between the light-receiving surface buried region 23 and the second exhaust-drain region 25b and extracts electrons generated in the light-receiving surface buried region 23, from the light-receiving surface buried region 23 to the second exhaust-drain region 25b. In the semiconductor element pertaining to the modification of the first embodiment, in order to increase the modulation degree of charge transfer to the charge accumulation region 24 from the light-receiving surface buried region 23, as illustrated in FIG. 5, the first exhaust-gate electrode 31a and the second exhaust-gate electrode 31b are arranged such that the charge transfer route from the light-receiving surface buried region 23 to the charge accumulation region 24 is sandwiched from both sides.

As shown in the plan view of FIG. 5, dash-dotted line is indicated, which surrounds the light-receiving surface buried region 23, the charge accumulation region 24, the charge read-out region 27, the first exhaust-drain region 25a and the second exhaust-drain region 25b. However, a well (p-well) of first conductivity type is formed outside the region illustrated by the dash-dotted line. A thick solid line surrounding the p$^+$-type pinning layer 26 that is located in an outer area than the dash-dotted line indicates a boundary of an element isolation region. That is, the portion outside the thick solid line that surrounds the pinning layer 26 is an area of an element-isolation insulating film (whose illustration is omitted) that is thicker than a gate insulating film. In each of the read-out gate electrode 32 and the exhaust-gate electrode 31, both of the ends are extended in the Y-direction and wired up to portions on the element-isolation insulating film outside the thick solid line that surrounds the pinning layer 26, as illustrated in FIG. 5.

Figure 6:
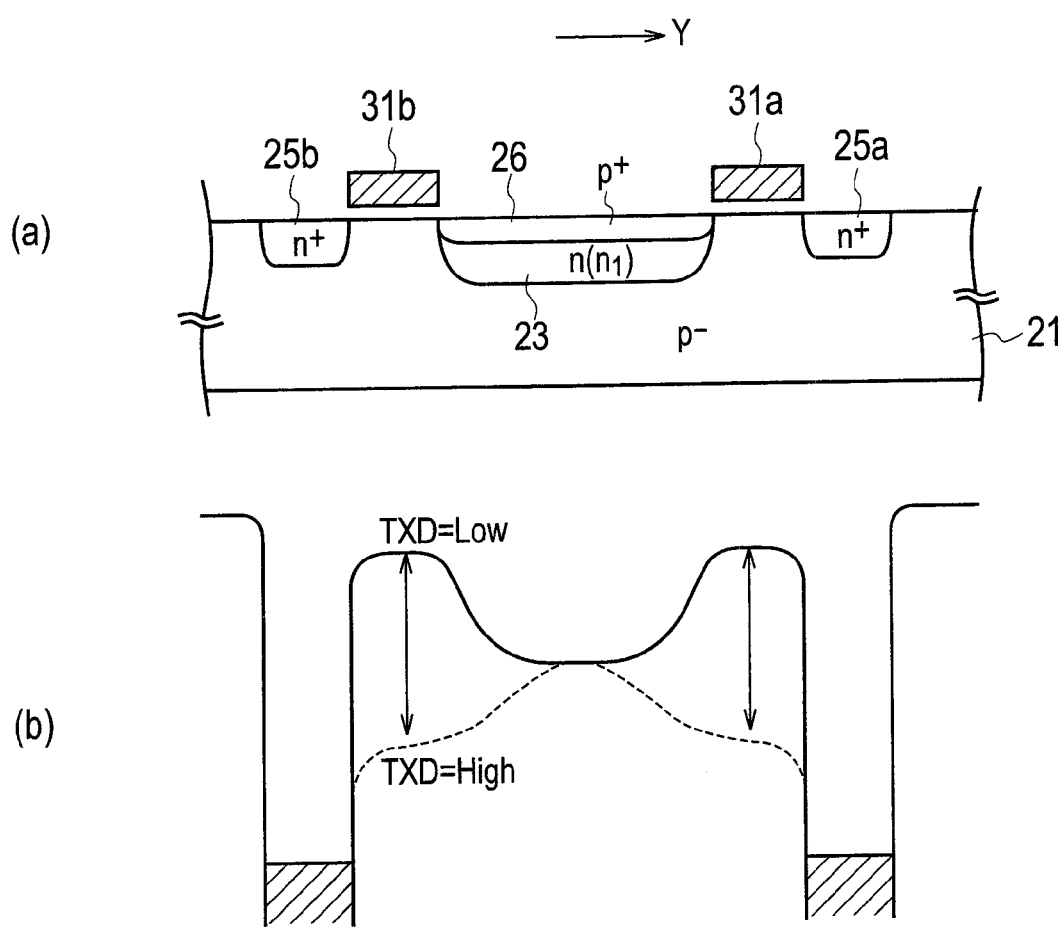
FIG. 6(a) is a schematic cross-sectional view taken from VI-VI direction in FIG. 5.
FIG. 6(b) is the corresponding potential diagram taken on a horizontal plane, the horizontal plane cut the second exhaust-drain region, the light-receiving surface buried region and the first exhaust-drain region illustrated in FIG. 6(a), the potential diagram corresponds to a potential shape of conduction band edge in a direction perpendicular to the charge transfer route from the light-receiving surface buried region to the charge accumulation region.

FIG. 6(*b*) is the potential diagram on the cross-section on which in the cross-sectional view of FIG. 6(*a*), the second exhaust-drain region 25*b*, the light-receiving surface buried region 23 and the first exhaust-drain region 25*a* are cut on a horizontal plane. Corresponding to the positions illustrated in FIG. 6(*a*), the potential shape of the conduction band end of the light-receiving surface buried region 23 is illustrated on the center of FIG. 6 (*b*). That is, the center of the FIG. 6(*b*) illustrates the potential shape of the conduction band end of the light-receiving surface buried region 23 when the charge transfer route to the charge accumulation region 24 from the light-receiving surface buried region 23 is vertically cut.

Moreover, on the right side of the central charge transfer route, a potential well of the conduction band edge of the first exhaust-drain region 25*a* is indicated by diagonal hatch with upward oblique lines to the right. On the other hand, on the left side of the central charge transfer route, a potential well of the conduction band end of the second exhaust-drain region 25*b* is indicated by diagonal hatch with upward oblique lines to the right. The potential barrier between the central charge transfer route indicated by the solid line and the potential well of the first exhaust-drain region 25*a* corresponds to the potential profile of the conduction band edge of the semiconductor region 21 just under the first exhaust-gate electrode 31*a*. The potential barrier between the central charge transfer route and the potential well of the second exhaust-drain region 25*b* corresponds to the potential profile of the conduction band edge of the semiconductor region 21 just under the second exhaust-gate electrode 31*b*.

As illustrated by the dashed line in FIG. 6(*b*), a high potential (TXD=High) is applied to the first exhaust-gate electrode 31*a* and the second exhaust-gate electrode 31*b*, and the charge transfer route is set to the potential of a hump shape whose center is convex, and electrons are dropped from a mountain ridge to the first exhaust-drain region 25*a* and the second exhaust-drain region 25*b* on both sides. On the other hand, a low potential (TXD=Low) is applied to the first exhaust-gate electrode 31*a* and the second exhaust-gate electrode 31*b*. Then, as illustrated by the solid line of FIG. 6(*b*), the potential barriers are formed between the central charge transfer route and the potential well of the first exhaust-drain region 25*a* and between the central charge transfer route and the potential well of the second exhaust-drain region 25*b*, respectively. Consequently, the potential shape between the first exhaust-drain region 25*a* and the second exhaust-drain region 25*b* is set to the inverted character W. That is, when the low potential (TXD=Low) is applied to the first exhaust-gate electrode 31*a* and the second exhaust-gate electrode 31*b*, because a valley-shaped (U-type) potential profile such that a potential at the center of the charge transfer route is lower than both sides is exhibited, electrons are transferred from the light-receiving surface buried region 23 to the charge accumulation region 24 along the U-shaped trench.

In this way, according to the structure illustrated in FIGS. 5 and 6, even if the gate structure is not provided between the light-receiving surface buried region 23 and the charge accumulation region 24, changing the potential shape on the basis of the voltage applied to the first exhaust-gate electrode 31*a* and the second exhaust-gate electrode 31*b* can control the transfer of charges to the charge accumulation region 24 from the light-receiving surface buried region 23. That is, in the semiconductor element pertaining to the modification of the first embodiment illustrated in FIGS. 5 and 6, the modulation of the transfer direction of electrons, which is driven by the first exhaust-gate electrode 31*a* and the second exhaust-gate electrode 31*b*, is achieved by controlling the potential profile (potential shape) of the charge transfer route through the use of electrostatic induction effect, rather than changing the direction of the electric field applied to the charges by the first exhaust-gate electrode 31*a* and the second exhaust-gate electrode 31*b*.

According to the solid-state imaging device pertaining to the modification of the first embodiment, only by controlling the potentials of the first exhaust-gate electrode 31*a* and the second exhaust-gate electrode 31*b* configured to extract the generated optical electrons, because the transfer to the charge accumulation region 24 can be controlled, the structure of the pixels can be simplified, and the resolution can be made higher. Also, since the gate structure and the switch do not exist in the charge transfer route to the charge accumulation region 24 from the light-receiving surface buried region 23, electrons are not trapped at the Si—SiO$_2$ boundary when electrons are passed under the gate electrode so that the high-speed transfer can be achieved, ands furthermore, the temporal resolution is improved. Moreover, because the light-receiving surface buried region 23 and the charge accumulation region 24 are formed into a single buried photodiode structure. the solid-state imaging device pertaining to the modification of the first embodiment is advantageous from the standpoint of the suppression of the noise, such as the suppressions of the dark current noise, the transfer noise and the like.

<Method for Manufacturing Semiconductor Element and Solid-State Imaging Device>

A manufacturing method of the semiconductor element and the solid-state imaging device pertaining to the first embodiment of the present invention illustrated in FIGS. 2 and 3 will be described below by using FIGS. 7 to 8, while focusing to a structure of the semiconductor element (pixel). By the way, because the manufacturing method of the semiconductor element and the solid-state imaging device, which will be described below, indicates one example, the semiconductor element and the solid-state imaging device can be naturally manufactured by using various manufacturing methods other than the following method, including modifications.

(a) At first, a p-type semiconductor substrate whose main surface is a (100) plane of about 30 to 0.65 ohm-cm (the impurity concentration is between about $4 \times 10^{14}$ cm$^{-3}$ and about $3 \times 10^{16}$ cm$^{-3}$) is prepared as the semiconductor region 21. After a thermal oxide film (SiO$_2$ film) of about 150 nm is formed on the main surface of the semiconductor region 21, a photoresist film is coated (spin-coated), and the photoresist film is delineated by photolithography technique, and a p-well formation region is opened. Next, boron ($^{11}$B$^+$) ions at a dose of about $10^{12}$ to $10^{13}$ cm$^{-2}$ are implanted through the thermal oxide film into the p-well formation region. Next, the portion of the well formation region in the thermal oxide film is etched and removed. Also, after the photoresist film is removed and a predetermined cleaning process is completed, the implanted boron ions are thermally diffused at about 1200 degree centigrade, and the p-well 22 is formed (see FIG. 7(*a*)). Here, the p-well 22 is simultaneously formed even in the peripheral circuit area and the read-out buffer amplifier arranged in each pixel $X_{ij}$. Also, n-wells (whose illustrations are omitted) are similarly formed on the peripheral circuit area. Moreover, after all of the thermal oxide films on the main surface of p-type semiconductor region 21 are removed (stripped), a pad oxide film (SiO$_2$ film) having a film thickness of about 100 nm is again formed on the main surface of the semiconductor region 21 by the thermal oxidizing method. After that, CVD method is used to grow a nitride film (Si$_3$N$_4$ film) having a film thickness of about 200 nm. The photoresist film delineated by photolithography technique is formed on the nitride film, and with the delineated photoresist film as a mask, reactive ion etching (RIE) is performed, and a mask of the nitride film for the selective oxidization (LOCOS) is formed. Then, the LOCOS method is used to form a field oxide film (element-isolation insulating film) 35 having a thickness between about 150 nm and about 1000 nm, preferably between about 200 nm and about 400 nm, on the opening 42 of the nitride film (see FIG. 7(a)).

(b) Next, although the illustration is omitted, after the removal of the nitride film, a dummy oxide film having a film thickness of several 10 nm is formed on the element formation region. Then, after the photolithography technique is used to cover the p-well 22 of the peripheral circuit with the photoresist film, the impurity ions for the gate-threshold voltage control (Vth-control) of pMOS are implanted. Next, after the removal of the photoresist film, the pattern of the photoresist film is formed on the region except the p-well 22, by using photolithography technique. In succession, simultaneously with the p-wells 22 of the peripheral circuit and the read-out buffer amplifier, the impurity ions for the gate-threshold voltage control of nMOS are implanted into the p-well 22. After that, the photoresist film is removed. Moreover, the dummy oxide film used as the protection film at the time of the Vth-control ion implantation is stripped.

Figure 7:
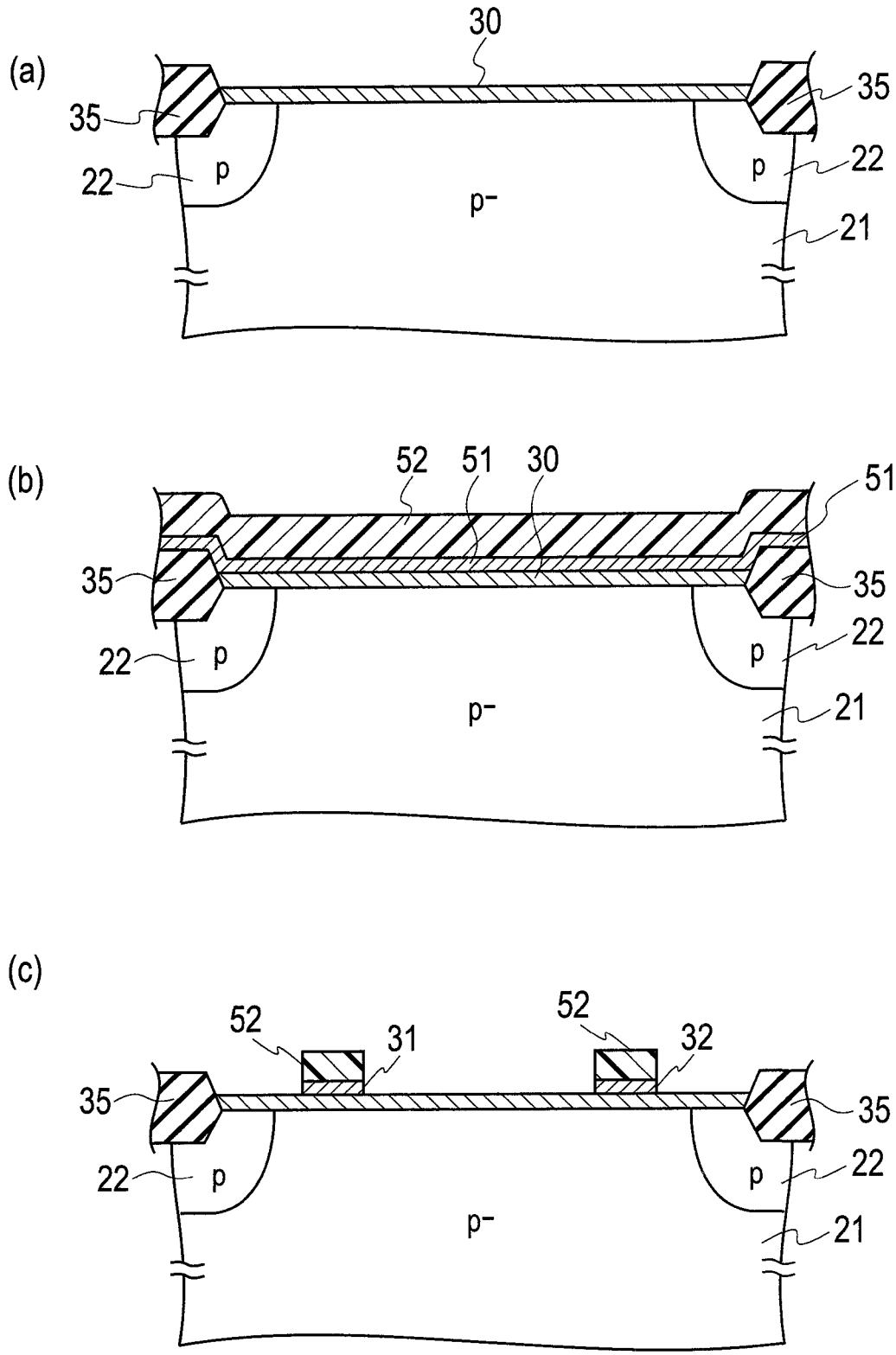
FIG. 7(a) is a process-flow cross-sectional view describing a manufacturing method of the semiconductor element and the solid-state imaging device, pertaining to the first embodiment of the present invention, and illustrates a process-stage at which a p-well is formed.
FIG. 7(b) is a subsequent process-flow cross-sectional view describing the manufacturing method of the semiconductor element and the solid-state imaging device, pertaining to the first embodiment, after the process-stage at the step illustrated in FIG. 7(a).
FIG. 7(c) is a subsequent process-flow cross-sectional view describing the manufacturing method of the semiconductor element and the solid-state imaging device, pertaining to the first embodiment, after the process-stage at the step illustrated in FIG. 7(b)
Figure 8:
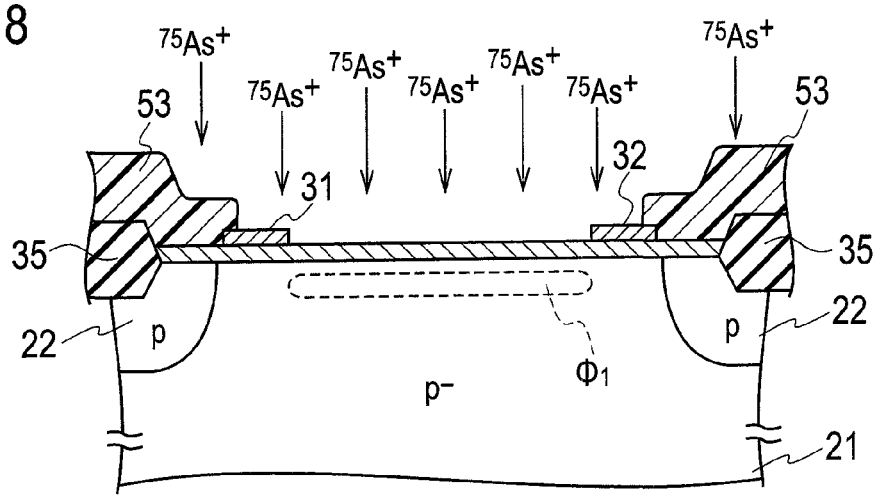
FIG. 8(a) is a subsequent process-flow cross-sectional view describing the manufacturing method of the semiconductor element and the solid-state imaging device, pertaining to the first embodiment, after the process-stage at the step illustrated in FIG. 7(c).
FIG. 8(b) is a subsequent process-flow cross-sectional view describing the manufacturing method of the semiconductor element and the solid-state imaging device, pertaining to the first embodiment, after the process-stage at the step illustrated in FIG. 8(a).
FIG. 8(c) is a subsequent process-flow cross-sectional view describing the manufacturing method of the semiconductor element and the solid-state imaging device, pertaining to the first embodiment, after the process-stage at the step illustrated in FIG. 8(b)
Figure 8:
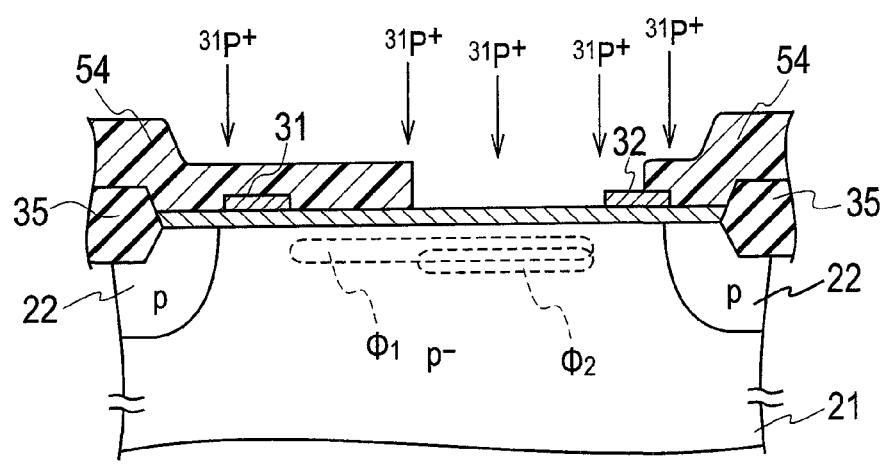
Figure 8:
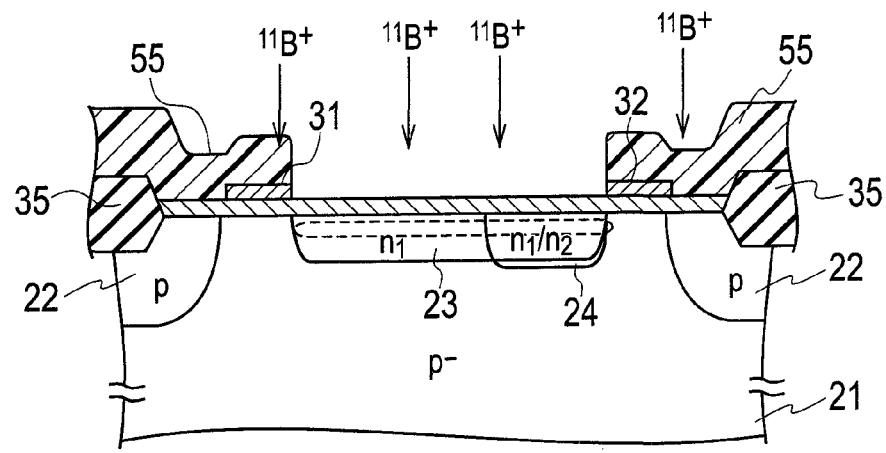

(c) Next, the surface of the semiconductor region 21 is thermally oxidized to form the gate insulating film 30 made of the oxide film ($SiO_2$ film), as illustrated in FIG. 7(a). Then, as illustrated in FIG. 7(b), a poly-silicon film 51 of about 200 to 400 nm is deposited on the entire surface of the gate insulating film 30, by CVD method. Moreover, a photoresist film 52 is coated on the poly-silicon film 51. Then, as illustrated in FIG. 7 (c), with the photoresist film 52 delineated by photolithography technique as the mask, when the poly-silicon film 51 is etched by RIE and the like, the patterns of the exhaust-gate electrode 31 and the read-out gate electrode 32 are delineated (in the case of the structure illustrated in FIGS. 5 and 6, the patterns of the first exhaust-gate electrode 31a and the second exhaust-gate electrode 31b are delineated). After that, the photoresist film 52 is removed.

(d) Next, a photoresist film 53 is coated on the semiconductor region 21. Then, a window is formed in the photoresist film 53 so that an area including both of the light-receiving surface buried region and the charge accumulation region is opened by using photolithography technique. Then, as illustrated in FIG. 8(a), using the photoresist film 53, the exhaust-gate electrode 31 and the read-out gate electrode 32 as masks, arsenic ($^{75}As^+$) ions are implanted at an order of a dose $\phi_1=10^{15}$ $cm^{-2}$ into a light-receiving surface buried region-formation scheduled region and a charge accumulation region-formation scheduled region on the surface of the semiconductor region 21. With regard to the exhaust-gate electrode 31 and the read-out gate electrode 32, arsenic ($^{75}As^+$) ions are implanted in a self-alignment manner. Thus, arsenic ($^{75}As^+$) ions are also implanted into the exhaust-gate electrode 31 and the read-out gate electrode 32. Simultaneously, arsenic ($^{75}As^+$) ions are similarly implanted into the p-wells 22 of the peripheral circuit and the read-out buffer amplifier, in the self-alignment manner with the poly-silicon gate electrode as the mask. At this time, arsenic ($^{75}As^+$) ions are also implanted into poly-silicon gate electrodes on the p-well 22 of the peripheral circuit whose illustration is omitted. After that, the photoresist film 53 is removed.

(e) Next, the photolithography technique is used to coat a photoresist film 54 on the semiconductor region 21. Then, a window is formed in the photoresist film 54 so that only the charge accumulation region-formation scheduled region is opened by using photolithography technique. Then, as illustrated in FIG. 8(b), the photoresist film 54 and the read-out gate electrode 32 are used as masks, and phosphorus ($^{31}P^+$) ions are implanted at an order of a dose $\phi_2=8\times10^{16}$ to $5\times10^{16}$ $cm^{-2}$ into the semiconductor region 21. With regard to the read-out gate electrode 32, since phosphorus ($^{31}P^+$) ions are implanted in the self-alignment manner, phosphorus ($^{31}P^+$) ions are also implanted into the read-out gate electrode 32. Simultaneously, in accordance with necessity, phosphorus ions are similarly implanted into the p-wells 22 of the peripheral circuit and the read-out buffer amplifier, in the self-alignment manner, with the poly-silicon gate electrode as the mask. At this time, phosphorus ($^{31}P^+$) ions are also implanted into the poly-silicon gate electrodes on the p-well 22 of the peripheral circuit whose illustration is omitted. After that, after the removal of the photoresist film 54, when a first activation thermal process (annealing) is performed on the semiconductor region 21, the charge accumulation region into which n-type impurity ions are implanted two times (the impurity concentration $n_1$ and the impurity concentration $n_2$) and the light-receiving surface buried region into which n-type impurity ions are implanted one time (only the impurity concentration $n_1$) are formed.

(f) Next, by using photolithography technique, a different photoresist film 55 is covered on the semiconductor region 21. Then, as illustrated in FIG. 8(c), with the photoresist film 55 as a mask, boron ($^{11}B^+$) ions are implanted at an order of $3\times10^{16}$ to $1\times10^{16}$ $cm^{-2}$ into the semiconductor region 21. Simultaneously, in accordance with necessity, boron ions are similarly implanted into the n-wells of the peripheral circuit and the voltage read-out buffer amplifier, in the self-alignment manner, with the poly-silicon gate electrode as the mask. At this time, boron ($^{11}B^+$) ions are implanted into the poly-silicon gate electrodes on the p-well 22 of the peripheral circuit whose illustration is omitted. After that, the photoresist film 55 is removed, and a pattern of a new photoresist film for covering the region that includes both of the light-receiving surface buried region and the charge accumulation region is delineated.

(g) Then, with the exhaust-gate electrode 31 and the read-out gate electrode 32 as the masks, arsenic ($^{75}As^+$) ions are implanted into the charge read-out region-formation scheduled region and the exhaust-drain region-formation scheduled region in the self-alignment manner. After that, when after the removal of the new photoresist film, a second activation thermal process is performed on the semiconductor region 21, as illustrated in FIG. 3(a), n-type light-receiving surface buried region 23, the $p^+$-type pinning layer 26, the $n^+$-type charge accumulation region 24 whose impurity concentration is higher than that of the light-receiving surface buried region 23, the $p^+$-type pinning layer 26, the $n^+$-type exhaust-drain region 25 and the $n^+$-type charge read-out region 27 are formed in the semiconductor region 21. (In the case of the structure illustrated in FIGS. 5 and 6, the first exhaust-drain region 25a and the second exhaust-drain region 25b are formed). Similarly, n-type source/drain regions are formed in the p-well 22 of the peripheral circuit whose illustration is omitted. At this time, the phosphorous ($^{31}P^+$), arsenic ($^{75}As^+$) and boron ($^{11}B^+$), which are implanted into the exhaust-gate electrode 31 and the read-out gate electrode 32, are also activated, which reduces the resistances of the exhaust-gate electrode 31 and the read-out gate electrode 32.

(h) Next, although the illustrations of the drawings after FIG. 8(c) are omitted, an inter-layer insulating film 36 is deposited in order to insulate the vertical signal lines and horizontal scanning lines to connect the respective pixels, or the metallic wiring layers for the connections between the respective transistors in the peripheral circuits, or the portion between the poly-silicon films implementing the gate electrodes (see FIG. 3(a)). As the inter-layer insulating film 36, it is possible to use the various dielectric films, such as the composite film implemented by double-layer structure of: an oxide film (CVD-SiO$_2$) having a film thickness of about 0.5 micrometers, which is deposited by CVD method; and a PSG film or BPSG film having a film thickness of about 0.5 micrometers, which is deposited on the oxide film (CVD-SiO$_2$) by CVD method. After the deposition by CVD method, the thermal process is performed. Thus, the BPSG film in the upper layer of the composite film is reflowed, and the surface of the inter-layer insulating film 36 is made flat. On the surface of the inter-layer insulating film 36, the photoresist film delineated by using photolithography technique is used as the mask, and the inter-layer insulating film 36 is etched by RIE or ECR ion-etching and the like, and contact holes to connect the metallic wiring layers and the transistors are formed. After that, the photoresist film used to form the contact holes is removed. Next, sputtering method or electron-beam vacuum evaporation method or the like is used to form aluminum alloy films (Al—Si, Al—Cu—Si) containing silicon and the like. Thereon, the photolithography technique is used to form the mask of the photoresist film, and the mask is used to delineate the aluminum alloy film through the RIE. Such series of processes are sequentially repeated. Consequently, the surface wiring to connect the exhaust-drain region 25 and the exhaust-gate electrode 31 to each other, the vertical signal lines and horizontal scanning lines to connect the respective pixels, or the metallic wiring layers for the connections between the respective transistors in the peripheral circuits are formed. Moreover, another inter-layer insulating film 36 is deposited on the metallic wiring layers. Then, the photolithography technique is used to delineate a metallic film having the openings 42 just on the semiconductor region of each pixel, and the light shielding film 41 is formed (see FIG. 3(a)). Then, when a passivation film having a film thickness of about one micrometer, which is intended to protect the mechanical damage and protect the immersions of water and impurities, is laminated on the light shielding film by CVD method, the solid-state imaging device pertaining to the first embodiment of the present invention is completed. The PSG film, the nitride film and the like are used as the passivation film.

As mentioned above, according to the manufacturing method of the semiconductor element and the solid-state imaging device pertaining to the first embodiment of the present invention, the formations of the light-receiving surface buried region 23, the p$^+$-type pinning layer 26, the charge accumulation region 24, the p$^+$-type pinning layer 26 and the charge read-out region 27 can be achieved by only adding the simple steps such as the ion implantation and the likes, as illustrated in FIG. 8(b), to the manufacturing step of the standard CMOS image sensor. Thus, while the standard CMOS is based, the solid-state imaging device that has the electronic shuttering function through the two-stage transferring architecture and can get the spatial resolution can be achieved by the standard CMOS process.

<Operation of Solid-State Imaging Device: Range-Finding Image Sensor>

The application of the lock-in pixel whose schematic configuration is illustrated in FIGS. 2 and 3 is severally considered. So, the application to a range-finding sensor using the flight time of light or a range-finding image sensor defined as a one-dimensional or two-dimensional array will be described below. That is, the light emitted as a repetitive pulse signal of a pulse width T$_0$ from a light source is reflected by a target and entered through a lens to the respective pixels X$_{11}$ to X$_{1m}$; X$_{21}$ to X$_{2m}$; . . . ; X$_{n1}$ to X$_{nm}$ in the solid-state imaging device (two-dimensional image sensor) illustrated in FIG. 1. That is, as illustrated in FIG. 3(a), the light is entered through the openings 42 of the light shielding films 41 in the respective pixels X$_{11}$ to X$_{1m}$; X$_{21}$ to X$_{2m}$; . . . ; X$_{n1}$ to X$_{nm}$ to the photodiodes D1 of the respective pixels X$_{11}$ to X$_{1m}$; X$_{21}$ to X$_{2m}$; . . . ; X$_{n1}$ to X$_{nm}$. The photodiode D1 receives the pulsed light of the pulse width T$_0$ entered through the opening 42 of the light shielding film as an optical signal and converts the optical signal into charges. Here, as relations between a timing when a high voltage (positive voltage) as the control signal TXD is applied to the exhaust-gate electrode 31, such as a timing illustrated in FIG. 9, and the optical-reception pulses of the pulse width T$_0$, the three kinds of relationships as illustrated in FIG. 9 (1), FIG. 9 (2) and FIG. 9 (3) are used.

As described already, when the high voltage (positive voltage) as the control signal TXD is applied to the exhaust-gate electrode 31, with the electric field caused by the potential profile of the inclination illustrated in FIG. 3(c), most of electrons generated in the light-receiving surface buried region 23 are extracted to the exhaust-drain region 25. On the other hand, when the low voltage (0V, or a negative voltage of about −1V) as the control signal TXD is applied to the exhaust-gate electrode 31, with the potential profile illustrated in FIG. 3(b), most of electrons (charges) generated in the light-receiving surface buried region 23 are transferred to the charge accumulation region 24.

Figure 9:
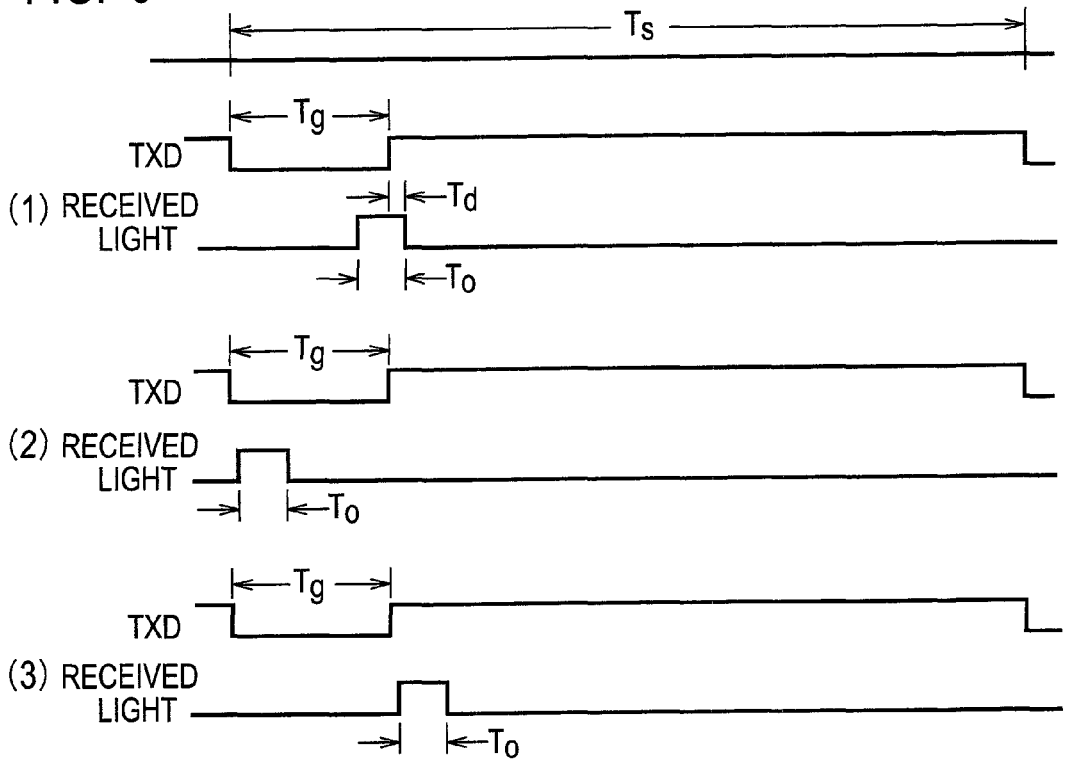
FIG. 9 is a timing chart describing a reading out method of the solid-state imaging device pertaining to the first embodiment, based upon the repetition period of a control signal TXD applied to the exhaust-gate electrode as a base.

At first, as illustrated in FIG. 9 (1), when an optical-reception pulse having a pulse width T$_0$ is incident at a timing such that a rising edge of the control signal TXD applied to the exhaust-gate electrode 31 lies in a period of the pulse width T$_0$, defining a delay time T$_d$ of the optical-reception pulse between the rising edge and the end of the pulse width T$_0$, charges Q$_1$, which are generated in the light-receiving surface buried region 23 by the optical-reception pulse and accumulated in the charge accumulation region 24, are given by:

$$Q_1 = I_p(T_0 - T_d) + Q_B + Q_{SR} \tag{1}$$

Here, I$_p$ indicates an optical current generated by the optical-reception pulse, Q$_B$ indicates the charges resulting from background light, and Q$_{SR}$ indicates the components, which are slow in response speed and act as offset charges in the light-receiving surface buried region 23, among the charges generated by the optical-reception pulse.

In FIG. 9 (2), in a measurement range targeted for a range-finding measurement, the timing of the optical-reception pulse is set such that the charges generated in the light-receiving surface buried region 23 by the optical-reception pulse of the pulse width T$_0$ are all accumulated in the charge accumulation region 24. In this timing, the accumulated charges Q$_2$ are represented by:

$$Q_2 = I_p T_0 + Q_B + Q_{SR} \tag{2}$$

In FIG. 9 (3), the timing of the optical-reception pulse is set such that the components generated in the light-receiving surface buried region 23 by the optical-reception pulse are all extracted to the exhaust-drain region 25. In this timing, the component Q$_{SR}$ of the offset charges that are slow in the response speed, and the component Q$_B$ resulting from the background light are captured so as to be accumulated in the charge accumulation region 24, and they are represented by the following Eq. (3).

$$Q_3 = Q_B + Q_{SR} \tag{3}$$

From Eq. (3), the delay time T$_d$ of the optical-reception pulse is known to be able to be determined by canceling the component Q$_B$ resulting from the background light included in Eqs. (1) and (2) and the component $Q_{SR}$ of the offset charges that are slow in the response speed, among the components of charges. That is, the delay time $T_d$ of the optical-reception pulse can be determined by the following Eq. (4).

$$T_d = T_0(Q_2-Q1)/(Q_2-Q_3) \quad (4)$$

Thus, a distance L up to the target is determined by using light velocity c, by the following Eq. (5).

$$L=(c/2)T_d=(c/2)T_0(Q_2-Q_1)/(Q_2-Q_3) \quad (5)$$

Actually, By defining a repetition period $T_S$ of the control signal TXD applied to the exhaust-gate electrode 31 illustrated in FIG. 9 as one cycle, the repetition period $T_S$ are repeated many times, and the sufficient number of electrons is accumulated in the charge accumulation region 24. After that, the signals of the respective pixels are read out to the outside of the image sensor. The series of the operations are sequentially performed as illustrated in FIGS. 9 (1), (2) and (3), and, on the basis of the signal voltages proportional to the respective read out charge quantities or the digital values proportional to the signal voltages, the distance is determined by carrying out the process corresponding to Eq (5), in arithmetic operation in a digital regime.

Figure 10:
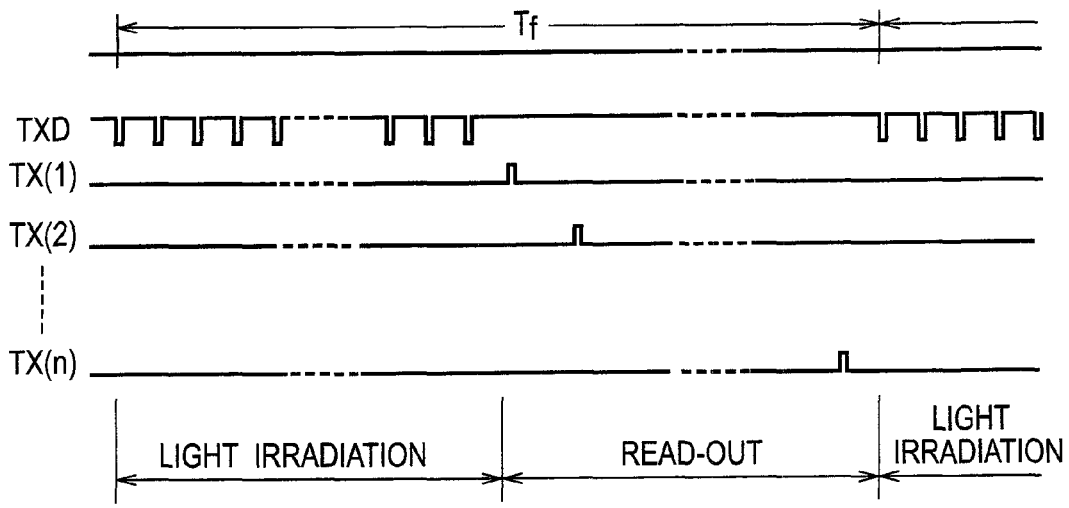
FIG. 10 is a timing chart describing the reading out method of the solid-state imaging device pertaining to the first embodiment, with regard to one frame.

FIG. 10 illustrates an actual example of the read-out timing of the image sensor. In the solid-state imaging device (two-dimensional image sensor) illustrated in FIG. 1, the control signal TXD common to all of the pixels is applied to the exhaust-gate electrode 31 in FIG. 2 and FIG. 3(*a*), and all of the pixels are operated at the same timing. Or, for example, signals that are different in timing for each row are applied, and the different signals may be applied in linkage to the read-out operation. As illustrated in FIG. 10, in a period of "light irradiation", the control signal TXD is repeatedly applied to the exhaust-gate electrode 31 many times at the repetition period $T_S$. Then, the extraction of charges to the exhaust-drain region 25 and the transfer of charges to the charge accumulation region 24 are repeated, and the sufficient number of electrons is accumulated in the charge accumulation region 24. After that, in a period of "read-out", the control signals TX(1), ..., TX(i), ..., TX(n−2), TX(n−1) and TX(n) are sequentially applied from the vertical scanning circuit 3 to the exhaust-gate electrodes 31 on the respective rows in the pixel array area 1 illustrated in FIG. 1, as illustrated in FIG. 10. Then, the signal electrons in the charge accumulation region 24 are read out. Because the method for reading out the signal to the outside of the image sensor does not differ from the CMOS image sensor of the charge transfer type that uses the conventional buried photodiode, the detailed explanation of the read-out operation is omitted. FIG. 10 illustrates only the timing of the TX signals applied to each row, in the read-out period.

According to the solid-state imaging device pertaining to the first embodiment, when the detection of charges is carried out in synchronization with the modulated optical signal, because the path of the charge transfer route for the sake of the signal detection is one, it is possible to achieve a range-finding image sensor in which the variation of pixel characteristics is reduced, for example, as compared with the conventional structure in which the charges are sorted and distributed to a plurality of charge accumulation regions 24 through the gate electrode structures from the photodiode.

<Operation of Solid-State Imaging Device: Measurement of Fluorescent Intensity and Life of Fluorescence>

As an application example of the solid-state imaging device pertaining to the first embodiment of the present invention, a method for picturing lifetimes of the fluorescence of the target will be described below. The measurement of the fluorescence life is useful in bioimaging. If the measurement can be achieved by using a semiconductor device, a simple light source and an optical system, it is possible to enlarge the applicable range of the lifetime measurement of the fluorescence.

Figure 11:
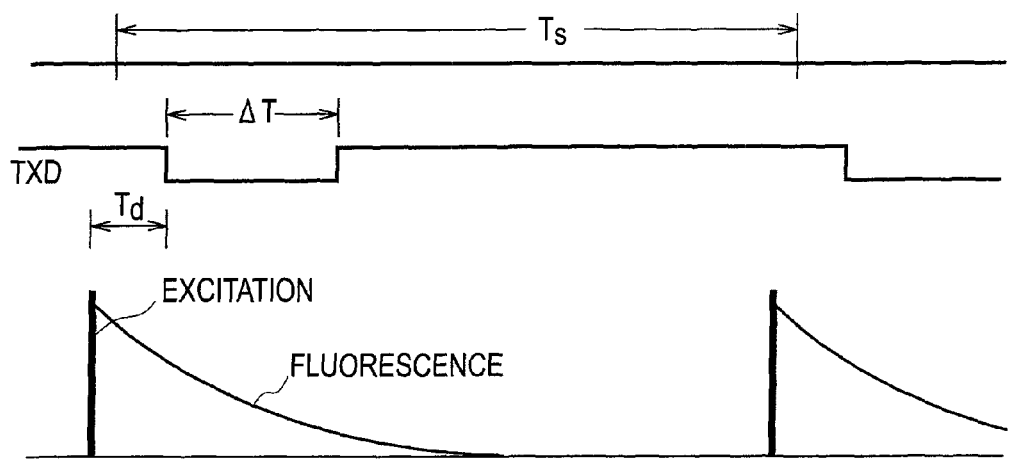
FIG. 11 is a timing chart when the solid-state imaging device pertaining to the first embodiment is used to measure lifetime of fluorescence.

FIG. 11 illustrates the timing chart when the lifetime of the fluorescence is measured by reducing a period $\Delta T$ in which the low voltage (0V, or the negative voltage of about −1V) as the control signal TXD is applied to the exhaust-gate electrode 31 and changing the timing $T_d$ of the pulse for each frame. In a period except the period $\Delta T$, the high voltage as the control signal TXD is applied to the exhaust-gate electrode 31, and the charges in the light-receiving surface buried region 23 are extracted to the exhaust-drain region 25. When an excitation light of repetitive pulses is irradiated, a fluorescence from the target, to which the excitation light is irradiated, responses belatedly.

Because the fluorescence is exponentially attenuated, when the fluorescent intensity is defined as P, a relation between the fluorescence P and a time T can be represented by Eq. (6) when 'tau' is defined as the lifetime of the fluorescence and $P_0$ is defined as an initial value of the fluorescent intensity.

$$P=P_0\exp(-t/\tau) \quad (6).$$

In FIG. 11, when in an interval from the timing $T_d=t_1$ to the end of period $\Delta T$, the low voltage as the control signal TXD is applied to the exhaust-gate electrode 31 and then the charges resulting from the fluorescence are transferred to the charge accumulation region 24 and if the delay time in the transfer of the fluorescent charges is ignored, the transferred charges $Q_1$ are given by the integration in the interval between the time $t_1$ and $t_1-\Delta T$, as represented by Eq (7).

$$Q_1 = k\int_{t_1}^{t_1+\Delta T} P_0\exp(-t/\tau)dt \quad (7)$$
$$= kP_0\tau\exp(-t_1/\tau)(1-\exp(-\Delta T/\tau))$$

The transferring operation is repeated many times. Here, without any change in the lifetime of the fluorescence, if the same fluorescence is repeated, the transferred charges $Q_1$ will increase to N times by the N repetitions.

Similarly, in FIG. 11, when in an interval from a timing $T_d=t_2$, which differs from the time $t_1$, to the end of period $\Delta T$, the low voltage as the control signal TXD is applied to the exhaust-gate electrode 31 and then the charges resulting from the fluorescence are transferred to the charge accumulation region 24 and if the delay time in the transfer of the fluorescent charges is ignored, the transferred charges $Q_2$ are given by the integration in the interval between the time $t_2$ and $t_2+\Delta T$, as represented by Eq (8).

$$Q_2 = k\int_{t_2}^{t_2+\Delta T} P_0\exp(-t/\tau)dt \quad (8)$$
$$= kP_0\tau\exp(-t_2/\tau)(1-\exp(-\Delta T/\tau))$$

From Eqs. (7) and (8), the lifetime 'tau' of the fluorescence can be represented by the following Eq. (9).

$$\tau=(t_2-t_1)/\ln(Q_1/Q_2) \quad (9)$$

Thus, the lifetime 'tau' of the fluorescence can be measured by reading the charges generated by the fluorescence at the different timings. By the way, the entire read-out operation as the image sensor is substantially similar to the operation described by using FIG. 10. Thus, the duplicative descriptions are omitted.

According to the solid-state imaging device pertaining to the first embodiment, when the detection of charges is carried out in synchronization with the modulated optical signal, because the path of the charge transfer route for the sake of the signal detection is one, it is possible to picture the lifetimes of the fluorescence, while the variation in each of pixel characteristics is reduced, for example, as compared with the conventional structure in which the charges are sorted and distributed to a plurality of charge accumulation regions 24 through the gate electrode structures from the photodiode.

The timing chart illustrated in FIG. 11 can be used not only in the case of measuring the lifetime of the fluorescence, but also in the case of measuring the fluorescent intensity. The measurement of the fluorescent intensity can be carried out, by merely opening a temporal window so that the component of the excitation light can be discarded (exhausted), and by transferring the charges only when the fluorescence is generated. Although the timing of the temporal window is fixed, because the fluorescence is desired to be collected as much as possible, just after the excitation by the light, the temporal window begins to be opened, and then, until the sufficient attenuation is achieved, the opening interval of the temporal window is made wide, namely, $\Delta T$ is made great.

Thus, in the case of the fluorescent intensity imaging, the temporal window $\Delta T$ is fixed, and after the charges resulting from the excitation light are sufficiently extracted, a exhaust-gate is closed, and only the charges generated by the fluorescence are transferred to the charge storage portion. Conventionally, in the fluorescent intensity imaging, when the component resulting from the excitation light and the component resulting from the fluorescence are separated, the fact that their wavelengths are different is used, and only an optical filter for performing a selection on the wavelength of the light is used. However, there is a case that the excitation light cannot be always sufficiently separated because the wavelength components of the excitation light and the fluorescence partially overlap with each other. As described in the present invention, the use combined with the selection through the temporal window can improve the separation performance and detect the smaller fluorescence.

(Second Embodiment)

When the wavelength of the light to be used is long, for example, such as near-infrared light and the like, and when electrons generated in the deep portion of the substrate are returned to the surface by diffusion, a part of electrons is captured in the charge accumulation region 24, and the capturing of electrons has influence on the modulation property. A structure for reducing influence on the modulation property will be described below in the second embodiment of the present invention. The entire configuration of the solid-state imaging device (two-dimensional image sensor) pertaining to the second embodiment of the present invention is equal to the block diagram show in FIG. 1. Thus, the duplicative descriptions are omitted. The planar structure of the semiconductor element in each of the pixels $X_{11}$ to $X_{1m}$; $X_{21}$ to $X_{2m}$; . . . ; $X_{n1}$ to $X_{nm}$ in the solid-state imaging device (two-dimensional image sensor) pertaining to the second embodiment is also similar to that of FIG. 2. Hence, the duplicative descriptions are omitted.

Figure 12:
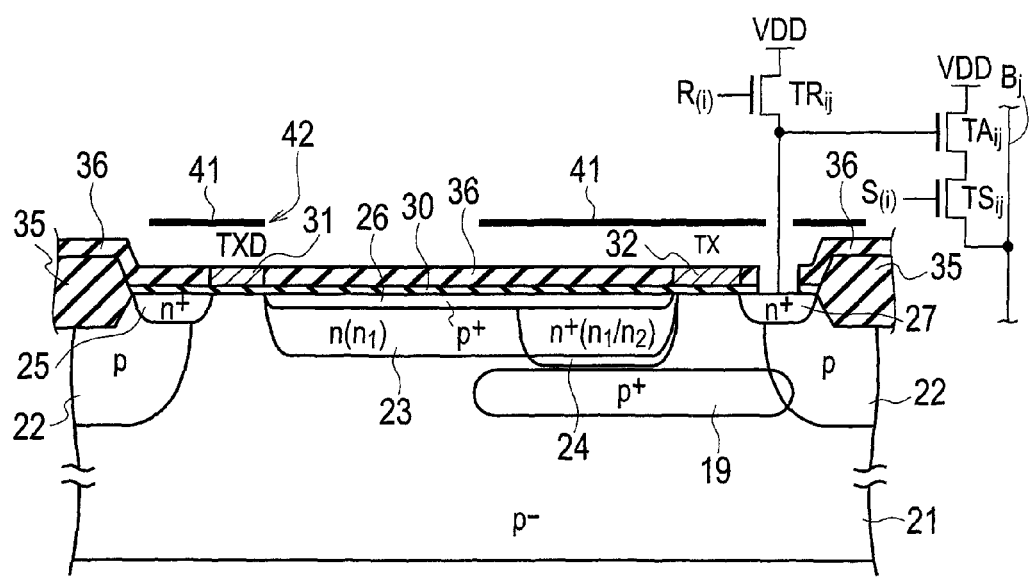
FIG. 12 is a schematic cross-sectional view of a semiconductor element serving as a part of pixel in a solid-state imaging device pertaining to a second embodiment of the present invention.

FIG. 12 corresponds to the cross-sectional configuration taken from III-III direction of the semiconductor element illustrated in FIG. 2. The solid-state imaging device pertaining to the second embodiment is similar to the solid-state imaging device pertaining to the first embodiment in that as illustrated in FIG. 12, the semiconductor element includes: a semiconductor region 21 of first conductivity type (p-type); a light-receiving surface buried region (light-receiving cathode region) 23 of second conductivity type (n-type) buried in a part of the upper portion of the semiconductor region 21 so as to receive incoming light, implementing the photodiode together with the semiconductor region 21; a charge accumulation region 24 of second conductivity type ($n^+$-type) buried adjacently (continuously) to the light-receiving surface buried region 23 on a part of the upper portion of the semiconductor region 21, with the field direction defined such that charges generated in the photodiode are transported toward the depth direction, the depth of the potential well is deeper than that of the light-receiving surface buried region 23, and the charges generated in the light-receiving surface buried region 23 are accumulated; a charge read-out region 27 of second conductivity type ($n^+$-type) for receiving the charges accumulated in the charge accumulation region 24; and an exhaust-drain region 25 of second conductivity type ($n^+$-type) for exhausting electrons generated in the light-receiving surface buried region 23. However, a configuration in which a carrier block layer 19 of first conductivity type ($p^+$-type) having a higher impurity concentration than the semiconductor region 21 is provided below the charge accumulation region 24 differs from the cross-sectional configuration of the semiconductor element illustrated in FIG. 3(a). The impurity concentration of the carrier block layer 19 is set to, for example, about $1\times10^{18}$ cm$^{-3}$ or more and $6\times10^{20}$ cm$^{-3}$ or less, and preferably set to about $3\times10^{18}$ cm$^{-3}$ or more and $2\times10^{20}$ cm$^{-3}$ or less. Typically, for example, a value of about $2\times10^{19}$ cm$^{-3}$ can be employed. The thickness of the carrier block layer 19 can be set between about 0.1 and one micrometer, preferably between about 0.3 and 0.7 micrometers.

Similarly to the topology illustrated by the dash-dotted line in FIG. 2, in the semiconductor element implementing each of the pixels $X_{11}$ to $X_{1m}$; $X_{21}$ to $X_{2m}$; . . . ; $X_{n1}$ to $X_{nm}$ in the solid-state imaging device pertaining to the second embodiment, the well (p-well) 22 of first conductivity type having a higher impurity concentration than the semiconductor region 21 is formed so as to surround the charge read-out region 27 and the exhaust-drain region 25. Instead of the semiconductor region 21 illustrated in FIG. 12, the silicon epitaxial growth layer of first conductivity type whose impurity concentration is lower than that of the semiconductor substrate, the silicon epitaxial growth layer is grown on the semiconductor substrate of first conductivity type may be employed. The light-receiving surface buried region 23 and the semiconductor region (anode region) 21 just under the light-receiving surface buried region 23 implement the first buried photodiode (photodiode) D1, and the charge accumulation region (cathode region) 24 and the semiconductor region (anode region) 21 just under the charge accumulation region 24 implement the second buried photodiode (charge storage photodiode) D2.

A $p^+$-type pinning layer 26 is arranged at a region spanning from on the light-receiving surface buried region 23 to on the charge accumulation region 24. Gate insulating films 30 are formed on the semiconductor region 21 on the $p^+$-type pinning layer 26 and on the semiconductor region 21 between the light-receiving surface buried region 23 and a charge read-out region 27. A read-out gate electrode 32, which controls the potential of the transferring channel formed between the charge accumulation region 24 and the charge read-out region 27 and transfers the charges from the charge accumulation region 24 to the charge read-out region 27, and an exhaust-gate electrode 31, which controls the potential of the exhausting channel formed between the light-receiving surface buried region 23 and the exhaust-drain region 25 and transfers electrons generated in the light-receiving surface buried region 23, from the light-receiving surface buried region 23 to the exhaust-drain region 25 is arranged on the gate insulating film 30. The gate insulating film 30 and the exhaust-gate electrode 31 on the gate insulating film 30 implement the first potential control means (31, 30), which controls the potential of the channel formed in the upper portion of the semiconductor region 21 between the light-receiving surface buried region 23 and the exhaust-drain region 25 and exhausts charges from the light-receiving surface buried region 23 to the exhaust-drain region 25. Also, the gate insulating film 30 and the read-out gate electrode 32 on the gate insulating film 30 implement the second potential control means (32, 30) which controls the potential of the channel formed in the upper portion of the semiconductor region 21 between the exhaust-gate electrode 31, the charge accumulation region 24 and the charge read-out region and transfers the charges from the charge accumulation region 24 to the charge read-out region. An inter-layer insulating film 36, which includes the read-out gate electrode 32 and the exhaust-gate electrode 31, is formed on the gate insulating film 30.

For example, when high voltage (positive voltage) as the control signal TXD is applied to the exhaust-gate electrode 31 connected to the exhaust-drain region 25, similarly to the illustration in FIG. 3(c), the inclination of the depleted potential is generated from the light-receiving surface buried region 23 to the exhaust-drain region 25. Most of electrons generated in the light-receiving surface buried region 23 are extracted to the exhaust-drain region 25. On the other hand, when low voltage (0V or the negative voltage of about −1V) as the control signal TXD is applied to the exhaust-gate electrode 31, similarly to the illustration in FIG. 3(b), the potential barrier against electrons is formed between the light-receiving surface buried region 23 and the exhaust-drain region 25. Then, the extraction of electrons is stopped from the light-receiving surface buried region 23 to the exhaust-drain region 25. Most of electrons (charges) generated in the light-receiving surface buried region 23 are transferred to the charge accumulation region 24.

As mentioned above, according to the solid-state imaging device pertaining to the second embodiment, without any installation of the special gate structure between the light-receiving surface buried region 23 and the charge accumulation region 24, only by controlling the potential of the exhaust-gate electrode 31 for extracting the generated optical electrons, it is possible to control the transfer of charges to the charge accumulation region 24. Thus, the structure of the pixel can be simplified, which can make the resolution high. However, the semiconductor element implementing the pixel of the solid-state imaging device pertaining to the second embodiment includes the carrier block layer 19 of first conductivity type (p-type) in the deep portion of the charge accumulation region 24, as illustrated in FIG. 12. Hence, in the case that the wavelength of the light to be used is long, when electrons generated in the deep portion of the semiconductor region 21 are returned to the surface by the diffusion, it is possible to block a part of electrons generated in the deep portion from being captured in the charge accumulation region 24. For this reason, even in the case that the wavelength of the light to be used is long, for example, such as the near-infrared light and the like, according to the solid-state imaging device pertaining to the second embodiment of the present invention, it is possible to suppress the influence, which is caused by electrons generated in the deep portion of the semiconductor region 21, the electrons are returned to the surface by the diffusion, on the modulation property of the transfer to the charge accumulation region 24 of the generation electrons, ascribable to the effectiveness of the potential control by the exhaust-gate electrode 31.

In addition, for example, the effectiveness that, since the gate structure and the switch do not exist in the charge transfer route to the charge accumulation region 24 from the light-receiving surface buried region 23, electrons are not trapped at the Si—SiO$_2$ boundary when electrons are passed under the gate electrode, and the high-speed transfer can be achieved, thereby improving the temporal resolution, and the effectiveness that, since the light-receiving surface buried region 23 and the charge accumulation region 24 are formed into a single buried photodiode structure, the simple configuration is advantageous from the standpoint of the suppression of the noise, such as the dark current noise, the transfer noise and the like, and the effectiveness that, when the detection of charges is carried out in synchronization with the modulated optical signal, the path of the charge transfer route for the sake of the signal detection is one, and it is accordingly possible to reduce the variation in each of pixel characteristics, for example, as compared with the conventional structure in which the charges are sorted and distributed to a plurality of charge accumulation regions 24 through the gate electrode structures from the photodiode, are substantially similar to the solid-state imaging device pertaining to the first embodiment. Thus, the duplicative descriptions are omitted.

(Other Embodiments)

As mentioned above, the present invention has been described by using the first and second embodiments. However, the discussions and drawings that implement a part of this disclosure should not be understood to limit the present invention. From this disclosure, various modifications, implementations and operational techniques would be evident for one skilled in the art.

Figure 13:
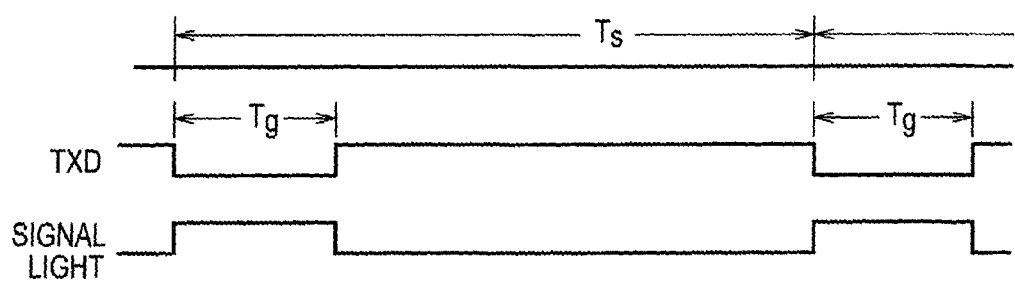
FIG. 13 is a timing chart in an architecture for relatively increasing LED illumination as a light source against background light.

For example, by using the structure described in the first or second embodiment of the present invention, the LED illumination serving as the light source used in the range-finding measurement and the like can be relatively increased against the background light. Here, as illustrated in FIG. 13, in synchronization with the timing of the light irradiation from the LED, low voltage as the control signal TXD is applied to the exhaust-gate electrode 31, and the charges generated by the LED are transferred to the charge accumulation region 24, and electrons generated in an interval other than the period for charge transfer to the charge accumulation region 24 are extracted to the exhaust-drain region 25. In the timing illustrated in FIG. 13, by reducing a duty ratio of the light irradiation when the light is repeatedly irradiated from the LED, it is possible to increase the maximum allowable drive current, as compared with the case of the direct current light irradiation. Thus, it is possible to decrease the number of the LEDs required to get the same light irradiation intensity.

Also, the structure described in the first or second embodiment of the present invention can be used as an all-pixel synchronized electronic shutter. Only when the electronic shutter is opened, the exhaust-gate electrode 31 is set to a low potential so that electrons generated by the light are transferred to the charge accumulation region 24, and in an interval while the electronic shutter is desired to be closed and an interval while the signal is read out, a high potential is applied to the exhaust-gate electrode 31 so that the generated optical electrons are extracted to the exhaust-drain region 25. In the all-pixel synchronized electronic shutter, the accumulation of charges and the read-out of the signal must be carried out in the intervals independent of each other. However, without any use of a mechanical shutter, the charge storage periods can be made coincident in all pixels. Thus, a photographic subject whose motion is quick can be imaged without any deformation.

Figure 14:
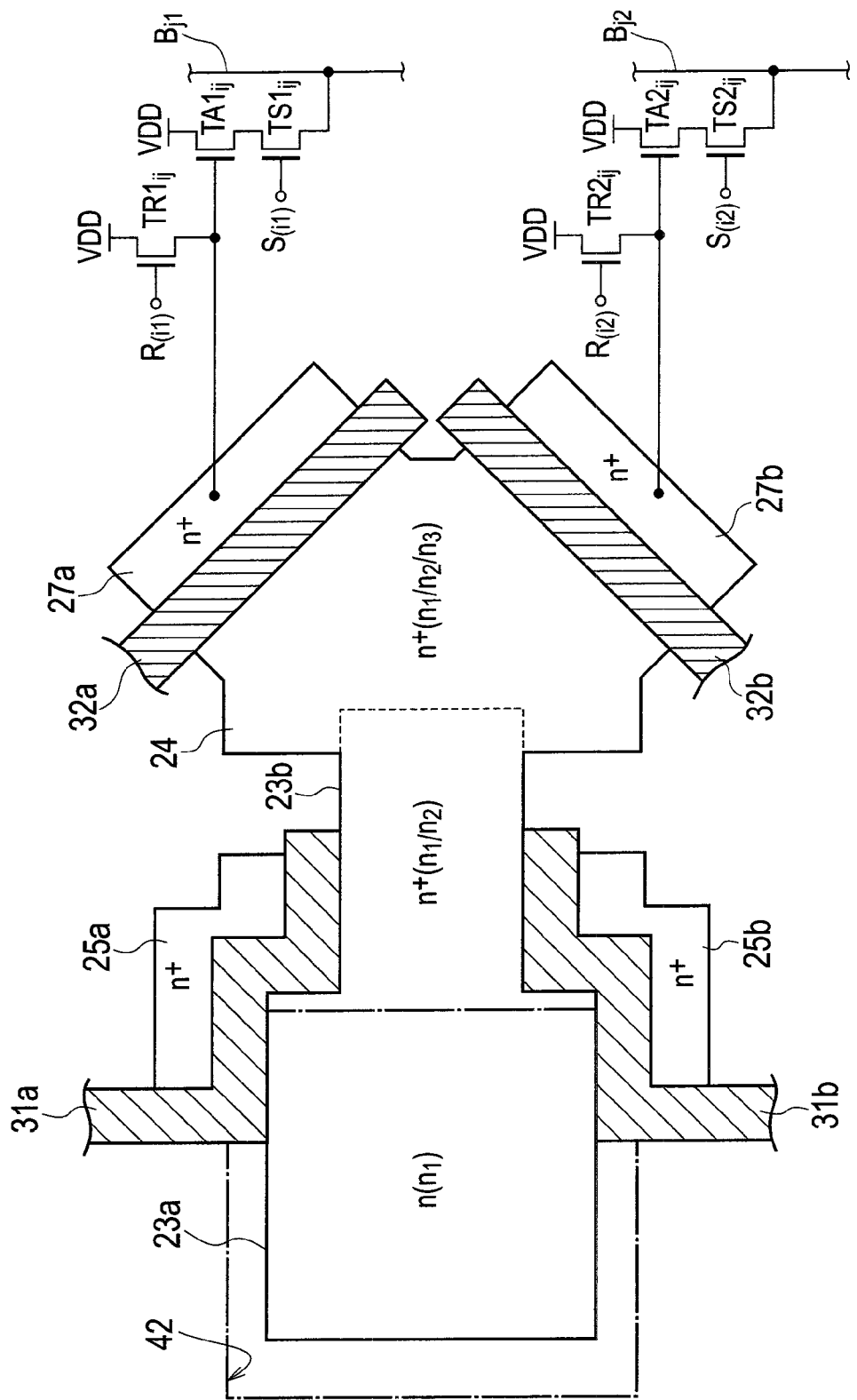
FIG. 14 is a schematic plan view describing a configuration of a semiconductor element serving as a part of pixel in a solid-state imaging device pertaining to another embodiment of the present invention.

Also, as illustrated in FIG. 14, on the right side of a light-receiving surface buried region 23a of second conductivity type (n-type) to which the light is irradiated, a transitional region 23b of second conductivity type ($n^+$-type) is arranged, the transitional region 23b has a deeper potential well (electron well) than the light-receiving surface buried region 23a, and on the right side of the transitional region 23b, a charge accumulation region 24 of second conductivity type ($n^+$-type) is arranged, the charge accumulation region 24 partially overlaps with the transitional region 23b and has a deeper potential well (electron well) than the transitional region 23b (see FIG. 3(b) and FIG. 3(c)) and accumulates the charges generated in the light-receiving surface buried region 23a through the transitional region 23b, and at an obliquely upward right portion and an obliquely downward right portion of the charge accumulation region 24, a first read-out gate electrode 32a and a second read-out gate electrode 32b may be arranged, respectively, which alternately distribute and read out the charges accumulated in the charge accumulation region 24, may be arranged. In the structure illustrated in FIG. 14, moreover, at an obliquely upward right portion of the first read-out gate electrode 32a, a first charge read-out region 27a of second conductivity type ($n^+$-type) is arranged which receives the charges accumulated in the charge accumulation region 24, and at an obliquely downward right portion of the second read-out gate electrode 32b, a second charge read-out region 27b of second conductivity type ($n^+$-type) is arranged which receives the charges accumulated in the charge accumulation region 24.

As illustrated in FIG. 14, since the transitional region 23b is prepared between the light-receiving surface buried region 23a and the charge accumulation region 24, the problem of a potential barrier caused by misalignment of mask positions on the planar pattern, the potential barrier is formed in the charge transfer route to the charge accumulation region 24 from the light-receiving surface buried region 23a, prohibiting a high-speed transferring, can be solved. Under the situation that the potential barrier is not formed between the light-receiving surface buried region 23a and the charge accumulation region 24, in order that the depth of the first potential well PW1 when the light-receiving surface buried region 23a is fully-depleted is shallower than the depth of the second potential well PW2 when the charge accumulation region 24 is fully-depleted in the staircase pattern, the respective impurity concentrations may be selected, for example, such that the impurity concentration of the transitional region 23b is higher than the impurity concentration of the light-receiving surface buried region 23a in the staircase pattern, and the impurity concentration of the charge accumulation region 24 is higher than the impurity concentration of the light-receiving surface buried region 23a in the staircase pattern. As the method for establishing a potential profile such that the impurity concentration of the transitional region 23b to be higher than the impurity concentration of the light-receiving surface buried region 23a in the staircase pattern and setting the impurity concentration of the charge accumulation region 24 to be higher than the impurity concentration of the transitional region 23b in the staircase pattern, it is possible to employ the known various methodologies. However, in order to avoid the formation of the potential barrier caused by the misalignment of mask positions on the planar pattern illustrated in FIG. 14, as illustrated in FIG. 14, n-type impurity ions are implanted into the charge accumulation region 24 three times (the impurity concentration $n_1$, the impurity concentration $n_2$, and an impurity concentration $n_3$) so that the deep second potential well PW2 is formed, and n-type impurity ions are implanted into the transitional region 23b two times (the impurity concentration $n_1$ and the impurity concentration $n_2$) so that the potential well of a middle depth is formed, and the ions are implanted into the region in which the shallow first potential well PW1 is desired to be formed only one time (only the impurity concentration $n_1$).

In the semiconductor element illustrated in FIG. 14, the light-receiving surface buried region 23a and the transitional region 23b are delineated into a shape such that the width measured along the upward and downward direction of the light-receiving surface buried region 23a is wider than the transitional region 23b in a stepwise configuration. At upper and lower portions of the light-receiving surface buried region 23a and the transitional region 23b, a first exhaust-drain region 25a and a second exhaust-drain region 25b of second conductivity type ($n^+$-type) are provided for exhausting electrons generated in the light-receiving surface buried region 23a, respectively, along the stepwise configuration. Then, a first exhaust-gate electrode 31a that is bent at a right angle so as to exhibit the shape of character Z is arranged between the light-receiving surface buried region 23a and the first exhaust-drain region 25a and between the transitional region 23b and the first exhaust-drain region 25a, and a second exhaust-gate electrode 31b that is bent at a right angle so as to exhibit the shape of character Z is arranged between the light-receiving surface buried region 23a and the second exhaust-drain region 25b and between the transitional region 23b and the second exhaust-drain region 25b. The first exhaust-gate electrode 31a controls the potential of the exhausting channel formed between the light-receiving surface buried region 23a and the first exhaust-drain region 25a and extracts electrons generated in the light-receiving surface buried region 23a, from the light-receiving surface buried region 23a to the upper first exhaust-drain region 25a. The second exhaust-gate electrode 31b controls the potential of the exhausting channel formed between the light-receiving surface buried region 23a and the second exhaust-drain region 25b and extracts electrons generated in the light-receiving surface buried region 23a, from the light-receiving surface buried region 23a to the lower second exhaust-drain region 25b.

As illustrated in FIG. 14, a gate electrode of a first signal read-out transistor $TA1_{ij}$ implementing a read-out buffer amplifier is connected to the first charge read-out region 27a. A drain electrode of the first signal read-out transistor $TA1_{ij}$ is connected to a power supply VDD, and a source electrode is connected to a drain electrode of a first switching transistor $TS1_{ij}$ for pixel selection. A source electrode of the first switching transistor $TS1_{ij}$ for the pixel selection is connected to a first vertical signal line $B_{j1}$, and a control signal S(i1) for selecting a horizontal line is applied to a gate electrode from the vertical scanning circuit (see FIG. 1). When the control signal S(i1) for selecting is set to high (H) level, the first switching transistor $TS1_{ij}$ is turned on, and a current corresponding to a potential of the first charge read-out region 27a that is amplified by the first signal read-out transistor $TA1_{ij}$ flows through the first vertical signal line $B_{j1}$. Moreover, a source electrode of a first reset transistor $TR1_{ij}$ implementing the read-out buffer amplifier is connected to the first charge read-out region 27a. A drain electrode of the first reset transistor $TR1_{ij}$ is connected to the power supply VDD, and a reset signal R(i1) is applied to a gate electrode. The reset signal R(i1) is set to high (H) level, and the charges accumulated in the first charge read-out region 27a are extracted, and the first charge read-out region 27a is reset. On the other hand, a gate electrode of a second signal read-out transistor TA2$_{ij}$ implementing a read-out buffer amplifier is connected to a second charge read-out region 27b. A drain electrode of the second signal read-out transistor TA2$_{ij}$ is connected to the power supply VDD, and a source electrode is connected to a drain electrode of a second switching transistor TS2$_{ij}$ for pixel selection. A source electrode of the second switching transistor TS2$_{ij}$ for the pixel selection is connected to a second vertical signal line B$_{j2}$, and a control signal S(i2) for selecting a horizontal line is applied to a gate electrode from the vertical scanning circuit (see FIG. 1). When the control signal S(i2) for selecting is set to high (H) level, the second switching transistor TS2$_{ij}$ is turned on, and a current corresponding to a potential of the second charge read-out region 27b that is amplified by the second signal read-out transistor TA2$_{ij}$ flows through the second vertical signal line B$_{j2}$. Moreover, a source electrode of a second reset transistor TR2$_{ij}$ implementing the read-out buffer amplifier is connected to the second charge read-out region 27b. A drain electrode of the second reset transistor TR2$_{ij}$ is connected to the power supply VDD, and a reset signal R(i2) is applied to a gate electrode. The reset signal R(i2) is set to high (H) level, and the charges accumulated in the second charge read-out region 27b are extracted, and the second charge read-out region 27b is reset.

In the semiconductor element illustrated in FIG. 14, when a read-out pulse signal TX is alternately applied to the first read-out gate electrode 32a and the second read-out gate electrode 32b, electrons generated by the optical signal are transferred from the charge accumulation region 24 to the first charge read-out region 27a on the obliquely upward right side and the second charge read-out region 27b on the obliquely downward right side. In short, an estimation distance L measure by the semiconductor element illustrated in FIG. 14 is given from a distribution rate between charges Q$_{1s}$, which are transferred from the charge accumulation region 24 to the first charge read-out region 27a on the obliquely upward right side and accumulated in the first charge read-out region 27a, and charges Q$_{2s}$, which are transferred from the charge accumulation region 24 to the second charge read-out region 27b on the obliquely downward right side and accumulated in the second charge read-out region 27b, as represented by Eq. (10).

$$L=(cT_{OP}/2)(Q_{2S}/(Q_{1S}+Q_{2S})) \quad (10)$$

Here, c indicates light velocity, and T$_{OP}$ indicates the pulse width of the pulsed light.

Also, in the descriptions of the first and second embodiments as mentioned above, they are described under the assumption that the first conductivity type is p-type and the second conductivity type is n-type. However, even under an assumption that the first conductivity type is n-type and the second conductivity type is p-type, the fact that the similar effectiveness can be achieved when the electrical polarities are made opposite may be easily understood. Here, for example, in such a way that the light-receiving surface buried region 23 illustrated in FIG. 3(a) serves as "a light reception anode region", the polarities and the corresponding names may be inverted (changed) correspondingly and properly. In the descriptions of the first and second embodiments, the charges being subjected to processes, such as the transfer, the accumulation and the like, are assumed to be electrons, and in the potential diagram, the downward direction (depth direction) on the drawing is assumed to be the positive direction of the potential. However, when the electrical polarities are made opposite, the charges being subjected to processes are holes. Thus, as for the potential shape that indicates the potential barrier, the potential valley, the potential well and the like in the semiconductor element, the downward direction (depth direction) on the drawing is represented to be the negative direction of the potential.

In the descriptions of the first and second embodiments, the two-dimensional solid-state imaging devices (area sensors) have been exemplified. However, the semiconductor element of the present invention should not be limitedly construed as being used only for the pixels in the two-dimensional solid-state imaging devices. For example, in the configuration of the two-dimensional matrix illustrated in FIG. 1, if the pixels of the one-dimensional solid-state imaging device (line sensor) are assigned as j=m=1, a plurality of semiconductor elements may be one-dimensionally arrayed should be easily understood from the content of the above disclosure.

In this way, the present invention naturally includes various implementations and the like that are not described here. Thus, only the specified features prescribed by claims, which are reasonable from the above descriptions, can determine the technical scope of the present invention.

INDUSTRIAL APPLICABILITY

The semiconductor element of the present invention and the solid-state imaging device that uses the semiconductor element as the pixel can be used in the technical fields of the various solid-state imaging devices, such as a time correlation image sensor for carrying out various measurements as well as a TOF range-finding image sensor, a bio-imaging and the like, because the structure of the pixel is simple, the resolution can be made high and the high temporal resolution is achieved by the high-speed transfer of charges.

| REFERENCE SIGN LIST | |
|---|---|
| 1 | Pixel Array Area |
| 2 | Horizontal scanning circuit |
| 3 | Vertical scanning circuit |
| 4 | Timing Generator |
| 19 | Carrier Block Layer |
| 21 | Semiconductor Region |
| 22 | p-well |
| 23 | Light-receiving surface buried region |
| 24 | Charge Accumulation region |
| 25 | Exhaust-drain region |
| 25a | First Exhaust-drain region |
| 25b | Second Exhaust-drain region |
| 26 | Pinning Layer |
| 27 | Charge Read-Out Region |
| 27a | First Charge Read-Out Region |
| 27b | Second Charge Read-Out Region |
| 30 | Gate Insulating film |
| 31 | Exhaust-gate electrode |
| 31a | First Exhaust-gate electrode |
| 31b | Second Exhaust-gate electrode |
| 32 | Read-Out Gate Electrode |
| 32a | First Read-Out Gate Electrode |
| 32b | Second Read-Out Gate Electrode |
| 41 | Light Shielding Film |
| 42 | Opening |
| 52 to 55 | Photoresist Film |

The invention claimed is:

1. A semiconductor element comprising:
 a semiconductor region of first conductivity type;
 a light-receiving surface buried region of second conductivity type buried in an upper portion of the semiconductor region, implementing a photodiode together with the semiconductor region;
 a charge accumulation region of second conductivity type buried in an upper portion of the semiconductor region, continuously to the light-receiving surface buried region, establishing a deeper potential well depth than the light-receiving surface buried region, defining depth direction of potential as a field direction along which charges generated in the photodiode are transported;

a charge read-out region configured to read out the charges accumulated in the charge accumulation region;

an exhaust-drain region buried in an upper portion of the semiconductor region, configured to extract the charges from the light-receiving surface buried region;

a first potential control means configured to modulate:
    extraction of the charges from the light-receiving surface buried region toward a direction to the exhaust-drain region direction; and
    transferring of the charges from the light-receiving surface buried region to the charge accumulation region direction,
    only by controlling a potential of a channel formed in an upper portion of the semiconductor region between the light-receiving surface buried region and the exhaust-drain region; and a second potential control means configured to control a potential of a channel formed in an upper portion of the semiconductor region between the charge accumulation region and the charge read-out region, transferring the charges from the charge accumulation region to the charge read-out region.

2. The semiconductor element of claim 1, wherein the charge accumulation region has a higher impurity concentration than the light-receiving surface buried region.

3. The semiconductor element of claim 1, wherein at least a part of the light-receiving surface buried region exhibits a plurality of stripe-shaped planar patterns.

4. The semiconductor element of claim 1, wherein at least a part of the first potential control means is arranged in a planar pattern to sandwich a part of the light-receiving surface buried region.

5. The semiconductor element of claim 1, wherein the first potential control means is arranged in a planar pattern to sandwich a charge transfer route from the light-receiving surface buried region to the charge accumulation region.

6. The semiconductor element of claim 1, further comprising a carrier block layer of first conductivity type having a higher impurity concentration than the semiconductor region, below the charge accumulation region.

7. A solid-state imaging device comprising a plurality of pixels being arrayed, each of the pixels comprising:
    a semiconductor region of first conductivity type;
    a light-receiving surface buried region of second conductivity type buried in an upper portion of the semiconductor region, implementing a photodiode together with the semiconductor region;
    a charge accumulation region of second conductivity type buried in an upper portion of the semiconductor region, continuously to the light-receiving surface buried region, establishing a deeper potential well depth than the light-receiving surface buried region, defining depth direction of potential as a field direction along which charges generated in the photodiode are transported;
    a charge read-out region configured to read out the charges accumulated in the charge accumulation region;
    an exhaust-drain region buried in an upper portion of the semiconductor region, configured to extract the charges from the light-receiving surface buried region;
    a first potential control means configured to modulate:
        extraction of the charges from the light-receiving surface buried region toward a direction to the exhaust-drain region direction; and
        transferring of the charges from the light-receiving surface buried region to the charge accumulation region direction,
        only by controlling a potential of a channel formed in an upper portion of the semiconductor region between the light-receiving surface buried region and the exhaust-drain region; and
    a second potential control means configured to control a potential of a channel formed in an upper portion of the semiconductor region between the charge accumulation region and the charge read-out region, transferring the charges from the charge accumulation region to the charge read-out region.

8. The solid-state imaging device of claim 7, wherein the charge accumulation region has a higher impurity concentration than the light-receiving surface buried region.

9. The solid-state imaging device of claim 7, wherein at least a part of the light-receiving surface buried region exhibits a plurality of stripe-shaped planar patterns.

10. The solid-state imaging device of claim 7, wherein at least a part of the first potential control means is arranged in a planar pattern to sandwich a part of the light-receiving surface buried region.

11. The solid-state imaging device of claim 7, wherein the first potential control means is arranged in a planar pattern to sandwich a charge transfer route from the light-receiving surface buried region to the charge accumulation region.

12. The solid-state imaging device of claim 7, further comprising a carrier block layer of first conductivity type having a higher impurity concentration than the semiconductor region, below the charge accumulation region.

* * * * *